(12) United States Patent
Mehrotra et al.

(10) Patent No.: US 11,784,641 B2
(45) Date of Patent: Oct. 10, 2023

(54) HIGH VOLTAGE CASCADED SUPERCASCODE POWER SWITCH

(71) Applicant: North Carolina State University, Raleigh, NC (US)

(72) Inventors: Utkarsh Mehrotra, Raleigh, NC (US); Douglas C. Hopkins, Raleigh, NC (US)

(73) Assignee: NORTH CAROLINA STATE UNIVERSITY, Raleigh, NC (US)

( * ) Notice: Subject to any disclaimer, the term of this patent is extended or adjusted under 35 U.S.C. 154(b) by 0 days.

(21) Appl. No.: 17/576,921

(22) Filed: Jan. 15, 2022

(65) Prior Publication Data

US 2022/0231684 A1 Jul. 21, 2022

Related U.S. Application Data

(60) Provisional application No. 63/137,821, filed on Jan. 15, 2021.

(51) Int. Cl.
*H03K 17/10* (2006.01)
*H03K 17/16* (2006.01)
*H03K 17/687* (2006.01)

(52) U.S. Cl.
CPC ....... *H03K 17/6874* (2013.01); *H03K 17/102* (2013.01); *H03K 17/161* (2013.01)

(58) Field of Classification Search
None
See application file for complete search history.

(56) References Cited

U.S. PATENT DOCUMENTS 6,822,842 B2    11/2004  Friedrichs et al.
8,455,948 B2 *  6/2013   Weis ............... H01L 23/528
                                                  257/77

(Continued)

FOREIGN PATENT DOCUMENTS

EP      3243276 B1     11/2019
WO   2010088783 A1     8/2010
WO   2011123962 A1    10/2011

OTHER PUBLICATIONS

B. Gao, A. J. Morgan, Y. Xu, X. Zhao and D. C. Hopkins, "6.0kV, 100A, 175kHz super cascode power module for medium voltage, high power applications," 2018 IEEE Applied Power Electronics Conference and Exposition (APEC), San Antonio, TX, 2018, pp. 1288-1293.

(Continued)

*Primary Examiner* — Kenneth B Wells
(74) *Attorney, Agent, or Firm* — Thomas | Horstemeyer, LLP

(57) ABSTRACT

Various examples are provided related to supercascode power switches that can be used in, e.g., HV and MV applications. This disclosure introduces a cascaded supercascode (CSC) power switch which can include a series of unit supercascode (USC) circuits; a control switch coupled in series with the series of USC circuits; and an external balancing network coupled to each of the n USC circuits. The series has a plurality of USC circuits, with each of the USC circuits including first and second switches coupled in series and an internal balancing network coupled across the first and second switches. A source of each of the USC circuits is a source of the first switch. The internal balancing network can include a capacitor connected between a gate of the second switch and the source of the first switch and a diode connected in parallel with the capacitor.

20 Claims, 21 Drawing Sheets

(56) References Cited

U.S. PATENT DOCUMENTS

| | | | |
|---|---|---|---|
| 8,569,842 B2 * | 10/2013 | Weis | H01L 27/0629 257/272 |
| 8,760,214 B2 * | 6/2014 | Biela | H03K 17/102 327/430 |
| 9,190,993 B1 | 11/2015 | Li | |
| 9,312,847 B1 | 4/2016 | Li | |
| 9,325,306 B1 | 4/2016 | Li | |
| 10,581,429 B2 * | 3/2020 | Weis | H02M 3/1588 |
| 11,196,415 B2 * | 12/2021 | Cairoli | H03K 17/102 |

OTHER PUBLICATIONS

Xiaoqing Song, A. Q. Huang, Xijun Ni and Liqi Zhang, "Comparative evaluation of 6kV Si and SiC power devices for medium voltage power electronics applications", 2015 IEEE 3rd Workshop on Wide Bandgap Power Devices and Applications (WiPDA), pp. 150-155, 2015.

B. Gao, A. Morgan, Y. Xu, X. Zhao, B. Ballard and D. C. Hopkins, "6.5kV SiC JFET-based Super Cascode Power Module with High Avalanche Energy Handling Capability," 2018 IEEE 6th Workshop on Wide Bandgap Power Devices and Applications (WiPDA), Atlanta, GA, 2018, pp. 319-322, doi: 10.1109/WiPDA.2018.8569146.

Song, et al., "15-kV/40-A FREEDM Supercascode: A Cost-Effective SiC High-Voltage and High-Frequency Power Switch", IEEE Transactions on Industry Applications, vol. 53, No. 6, Nov./Dec. 2017.

Gill, et al., "A Comparative Study of SiC JFET Super-Cascode Topologies", IEEE Energy Conversion Congress and Expoistion (ECCE), Oct. 10-14, 2021.

Mehrotra, et al., "A New Cascaded SuperCascode High Voltage Power Switch", IEEE 2021.

Mehrotra, et al., "Analytical Method to Optimize the Cascaded SuperCascode Power Switch Balancing Network", IEEE 8th Workshop on Wide Bandgap Power Devices and Applications, 2021.

Biela, et al., "Balancing Circuit for a 5-kV/50-ns Pulsed-Power Switch Based on SiC-JFET Super Cascode", IEEE transactions on plasma science, vol. 40, No. 10, Oct. 2012.

Mehrota, et al., "Bidirectional Solid-State Circuit Breaker using Super Cascode for MV SST and Energy Storage Systems", IEEE Journal of Emerging and Selected Topics in Power Electronics., 2021.

Lyu, et al., Dynamic Voltage Balancing for the High-Voltage SiC Super-Cascode Power Switch, IEEE Journal of emerging and selected topics in power electronics.,m vol. 7, No. 3, Sep. 2019.

Mehrotra, et al., "High Current Medium Voltage Bidirectional Solid State Circuit Breaker using SiC JFET Super Cascode", IEEE Energy conversion congress and exposition (ECCE) 2020.

Bhalla, et al., "Ultra-high voltage (40kV) switches implemented using SiC super cascodes," PCIM Europe 2019 International Exhibition and Conference for Power Electronics., 2019.

P. Friedrichs, H. Mitlehner, R. Schorner, K.—. Dohnke, R. Elpelt and D. Stephani, "Stacked high voltage switch based on SiC VJFETs," ISPSD '03. 2003 IEEE 15th International Symposium on Power Semiconductor Devices and ICs, 2003. Proceedings., Cambridge, UK, 2003, pp. 139-142, doi: 10.1109/ISPSD.2003.1225249.

Li, et al., "USCi SiC JFET cascode and super cascode technologies," PCIM Asia, Jun. 26-28, 2018, Shanghai, China.

\* cited by examiner

-- PRIOR ART --

Block diagram of three-layer 24 JFET 2S-3C-2C-2C Cascaded SuperCascode Power Switch CSC with avalanche resistors in series with diodes for extra avalanche robustness

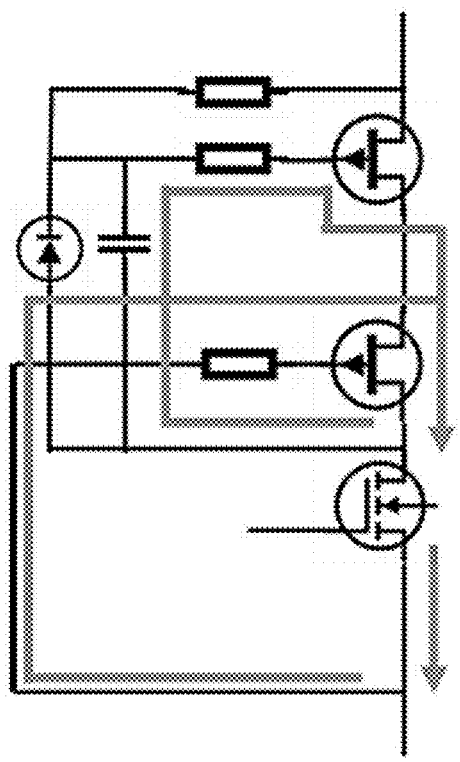
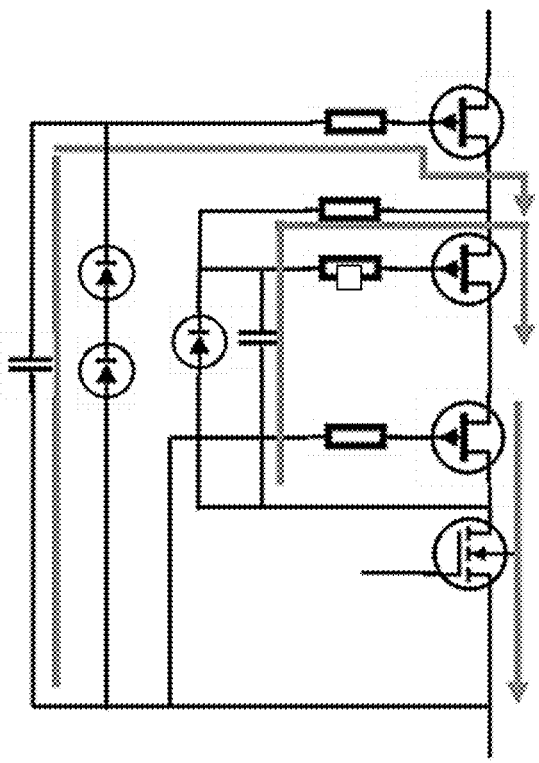
FIG. 4A  FIG. 4B
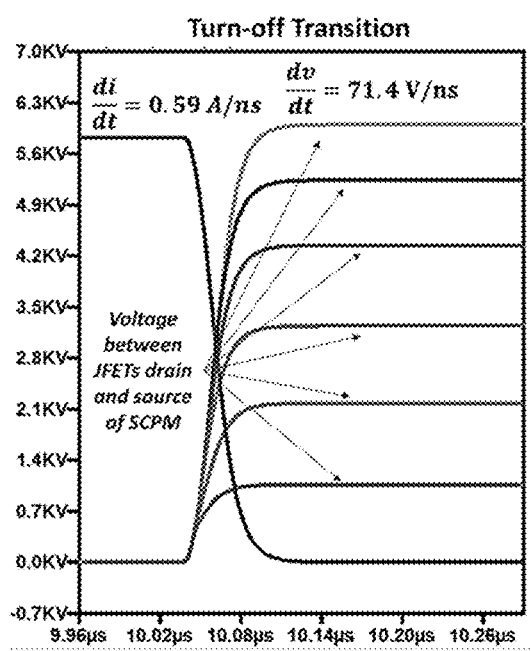
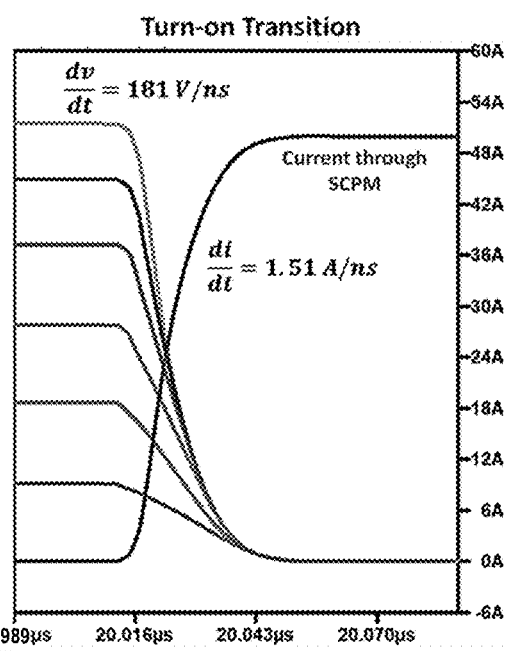
FIG. 5

HIGH VOLTAGE CASCADED SUPERCASCODE POWER SWITCH

CROSS REFERENCE TO RELATED APPLICATIONS

This application claims priority to, and the benefit of, co-pending U.S. provisional application entitled "High Voltage Cascaded Supercascode Power Switch" having serial no. 63/137,821, filed Jan. 15, 2021, which is hereby incorporated by reference in its entirety.

STATEMENT REGARDING FEDERALLY SPONSORED RESEARCH OR DEVELOPMENT

The present invention was made with United States government support under grant number W911NF1820135 awarded by the US Army Research Laboratory (ARMY/ARL). The United States government has certain rights in the invention.

BACKGROUND

DC compared to AC systems have fewer power conversion stages due to simplification of different types of generation and energy storage systems (ESS). Other advantages of DC systems are:
- Simpler operation and control, no synchronization of phase angles and frequency between generators required;
- Reduced size and cost, no low-frequency AC voltage regulation transformers; and
- Increased power rating of cabling, no skin effect and voltage drop due to reactive power, and increased power flow dependent on the continuous voltage and current.

However, DC systems also bring challenges, such as fault detection, current interruption, and complicated non-linear modeling in design. Growing demand for medium voltage micro-grids and DC distribution systems has engendered further interest in solid state circuit breakers (SSCBs).

Medium Voltage (MV), High Current (HC) switches can be used for MV applications in land, sea and air transport, fast charging, renewable energy, and a host of applications in pulsed power, e.g. solid-state protection. However, widespread adoption of commercially available MV-HC modules is limited due to retracted dynamic performance from paralleling many high voltage, low current semiconductors. The associated cost is relatively high because of low yield, and expensive material and fabrication. Because of the lack of commercially available medium and high-voltage devices and their comparable low yield rate driving cost, new alternative ways of realizing MV-HC devices are desired.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 3A-3B and 4A-4B illustrate CSC power switch (CSCPS) turn-off and run-on sequences, in accordance with various embodiments of the present disclosure.

FIG. 5 illustrates operational characteristics of individual JFETs in an SC, in accordance with various embodiments of the present disclosure.

DETAILED DESCRIPTION

Figures 1A, 1B, 1C:
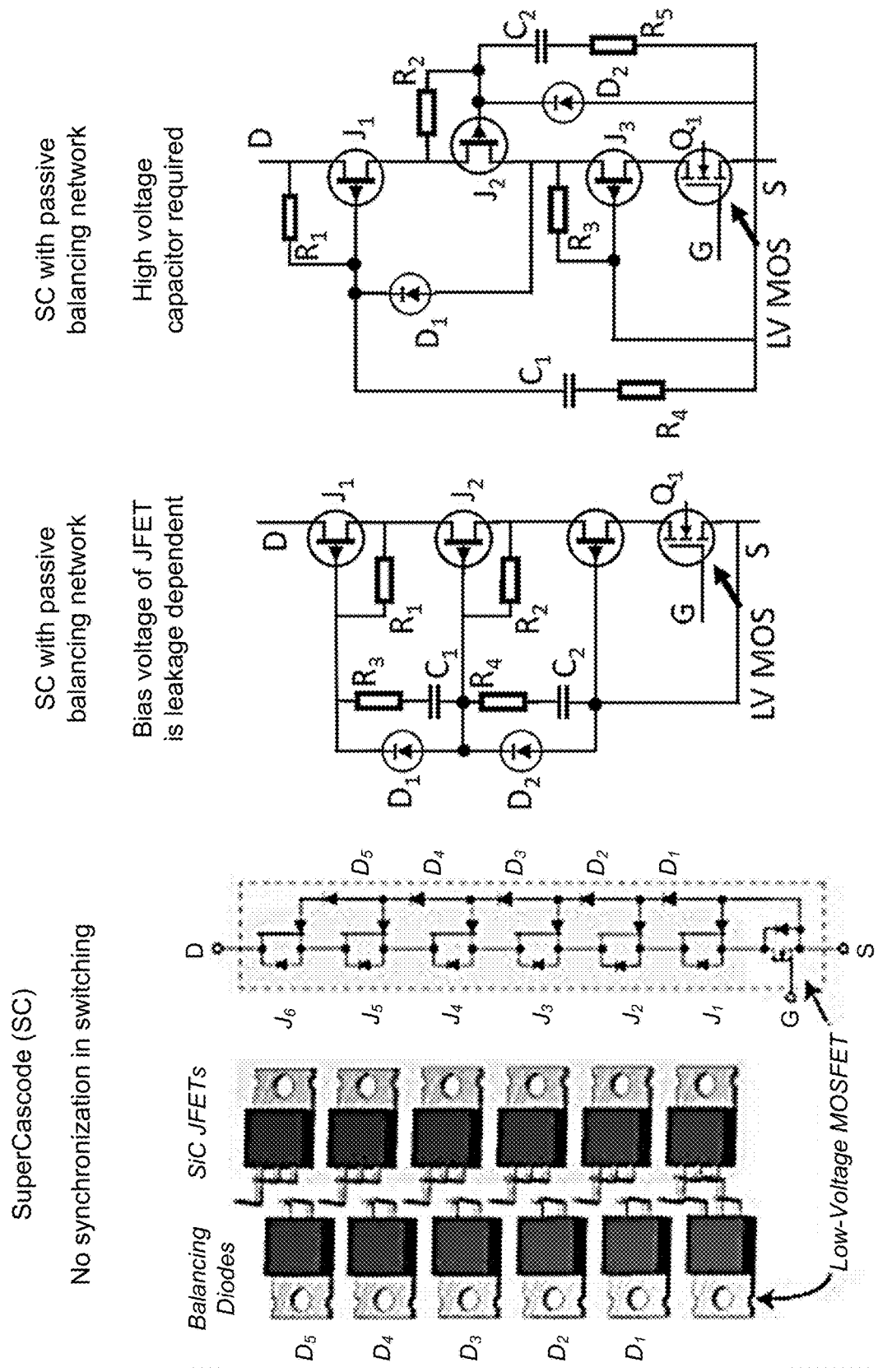
FIGS. 1A-1D illustrate examples of SC structures, in accordance with various embodiments of the present disclosure.

Disclosed herein are various examples related to cascaded supercascode power switches for high voltage (HV) and medium voltage (MV) applications, i.e. hundreds to thousands of volts. Reference will now be made in detail to the description of the embodiments as illustrated in the drawings, wherein like reference numbers indicate like parts throughout the several views.

To achieve HV-HC power switches for MW power, either many HV-low current semiconductors devices can be paralleled, or many low voltage-HC devices can be placed in series. Ideal paralleling would have each parallel device trigger the next device when current levels begin to rise whereas series devices would have each trigger the next when the voltage levels rise. As most modern-day power devices are field triggered, (i.e., voltage-driven) self-triggering series devices with voltage signals is natural and easily implemented with serial LV-HC devices. Serial connection of Si IGBTs and SiC MOSFET in Austin SuperMOS can be used to realize HV switches. However, they use individual gate drive signals per device in a string, isolated driver and unequal voltage stress among devices that limits scalability and performance. The supercascode (SC) structure can use self-triggering normally-on, serially connected SiC JFETs triggered by a single serial Si MOSFET.

The SC structure includes multiple Low Voltage (i.e. tens of volts to thousands of volts), High Current (LV-HC) semiconductors such as, e.g., SiC JFETs or GaN FETS, in series, parallel, or combinations with simple balancing elements controlling voltage distribution across the string. The SC structure can utilize a Si Control MOSFET to provide a normally-off characteristic, and works on the principle of self-triggered, sequential semiconductors, though normally on semiconductors can be used. The topology is scalable and applicable to any depletion mode device, such as JFETs, vacuum tubes, MEMS switches and mechanical switches wherein the activation coils could be configured to be normally-on and the contacts made are in series. For example, any n-channel or depletion mode GaN or SiC devices (e.g., MOSFET, JFET or SIT devices) can be used with a low voltage normally-off device with 50V or less rating as the control switch.

The SC, compared to, for example, HV Si IGBTs, allows faster control, reduces harmonics and reduces filter component sizing. Advantages over paralleled HV SiC MOSFET include, e.g.:
  Low Cost per Ampere (SCs Cost/A is 3× less than SiC MOSFETs);
  More reliable, since a failed SiC-JFET does not compromise the switch unlike HV-LC (i.e. amperes to thousands of amperes) parallel MOSFETs;
  Robust performance at high temperatures, since JFETs have a stable threshold voltage over temperature (JFETs have <10 mV vs. >300 mV threshold shift at 175° C.); and
  3× better energy handling capacity, (SiC-JFETs can handle 44.6 J/cm² compared to 13.5 J/cm² before failure).

Figure 1D:
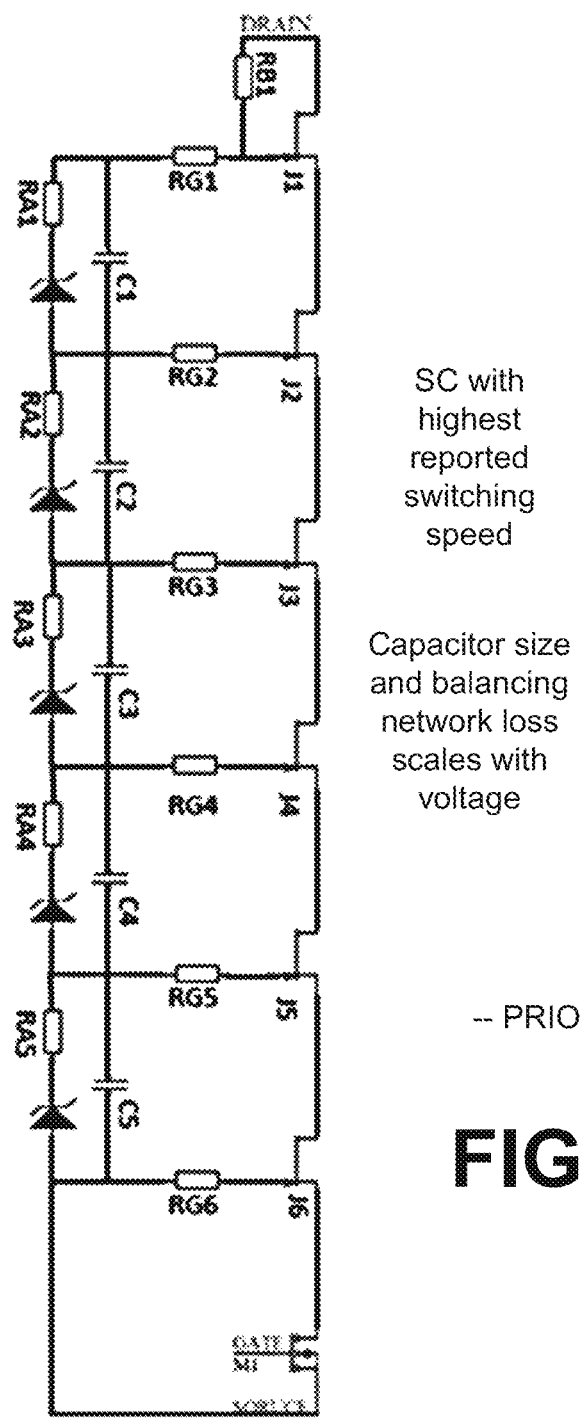

FIGS. 1A-1D show examples of SC structures with limitations for scalability. FIG. 1A illustrates the initially proposed SC topology, FIGS. 1B and 1C illustrate SC topologies with a dynamic balancing network, and FIG. 1D illustrates a SC topology using different SiC JFET devices.

This disclosure introduces a new CSC switch design approach. The design approach minimizes balancing network size, improves switching speed and improves avalanche capability compared to various SCs shown in FIGS. 1A-1D. The mathematical design equations that enable users to design an HV-HC switch and optimization scheme are explained. The DPT testing and a 371 A curve tracer was used to verify its unique blocking characteristic. Test results report a 4.5× improvement in switching speed (average of $T_{on}$ and $T_{off}$) and a 40% reduction in switching losses compared to present state of art SCs.

Figure 2A:
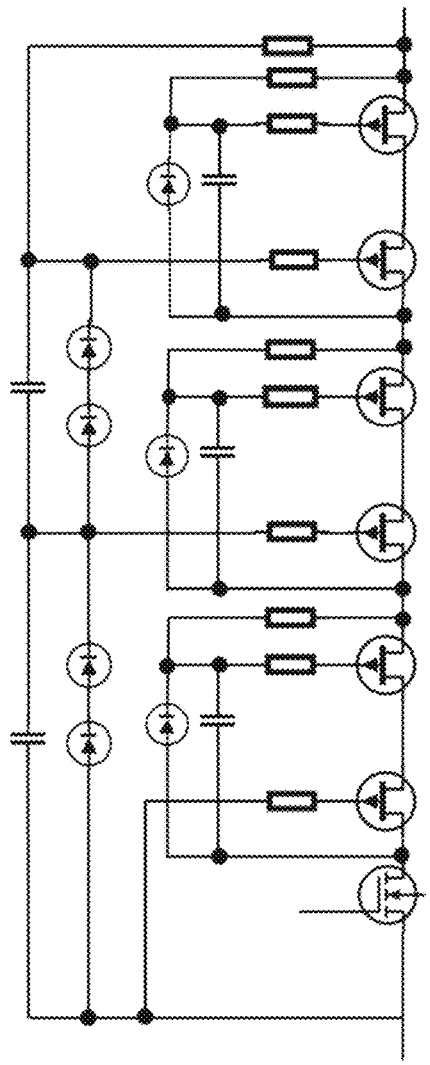
FIGS. 2A-2E are schematic diagrams illustrating examples of cascaded SC (CSC) topologies, in accordance with various embodiments of the present disclosure.
Figure 2B:
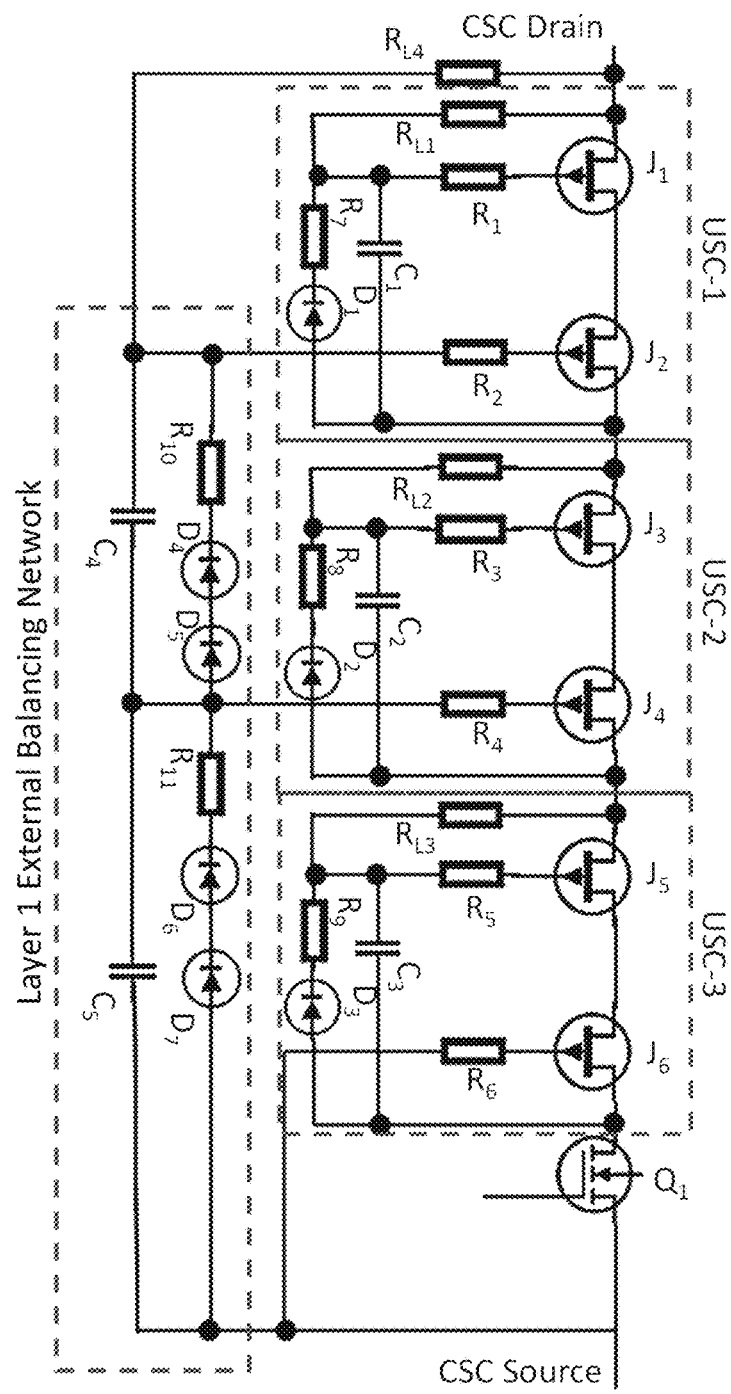

The cascaded SC (CSC) approach partitions the balancing (or optimizing) network to reduce the JFET triggering charge requirement to improve switching speed and reduce losses. FIG. 2A is a diagram illustrating an example of the CSC structure, which can be optimized for switching, low loss and removing bias voltage stress away from the JFETs. The CSC concept essentially removes the bottom Si MOSFET and uses the bottom JFET to control a CSC cell referred to as a Unit SuperCascode (USC) as shown in FIG. 2B. Each USC (e.g., USC-1, USC-2, USC-3) has an internal balancing (or optimizing) network. Multiple USCs can be serially connected to form the CSC, wherein each USC is triggered by an external balancing (or optimizing) network layer comprising a capacitor, gate resistor and avalanche diode (Layer 1 in FIG. 2B). Resistors can be added in series with the avalanche diodes to increase robustness and prevent diode failure. Series diodes, such as $D_4$ and $D_5$, can be combined into one diode. A plurality of external balancing networks which directly drive the bottom connected normally-on device present in a USC structure can be utilized.

Figure 2C:
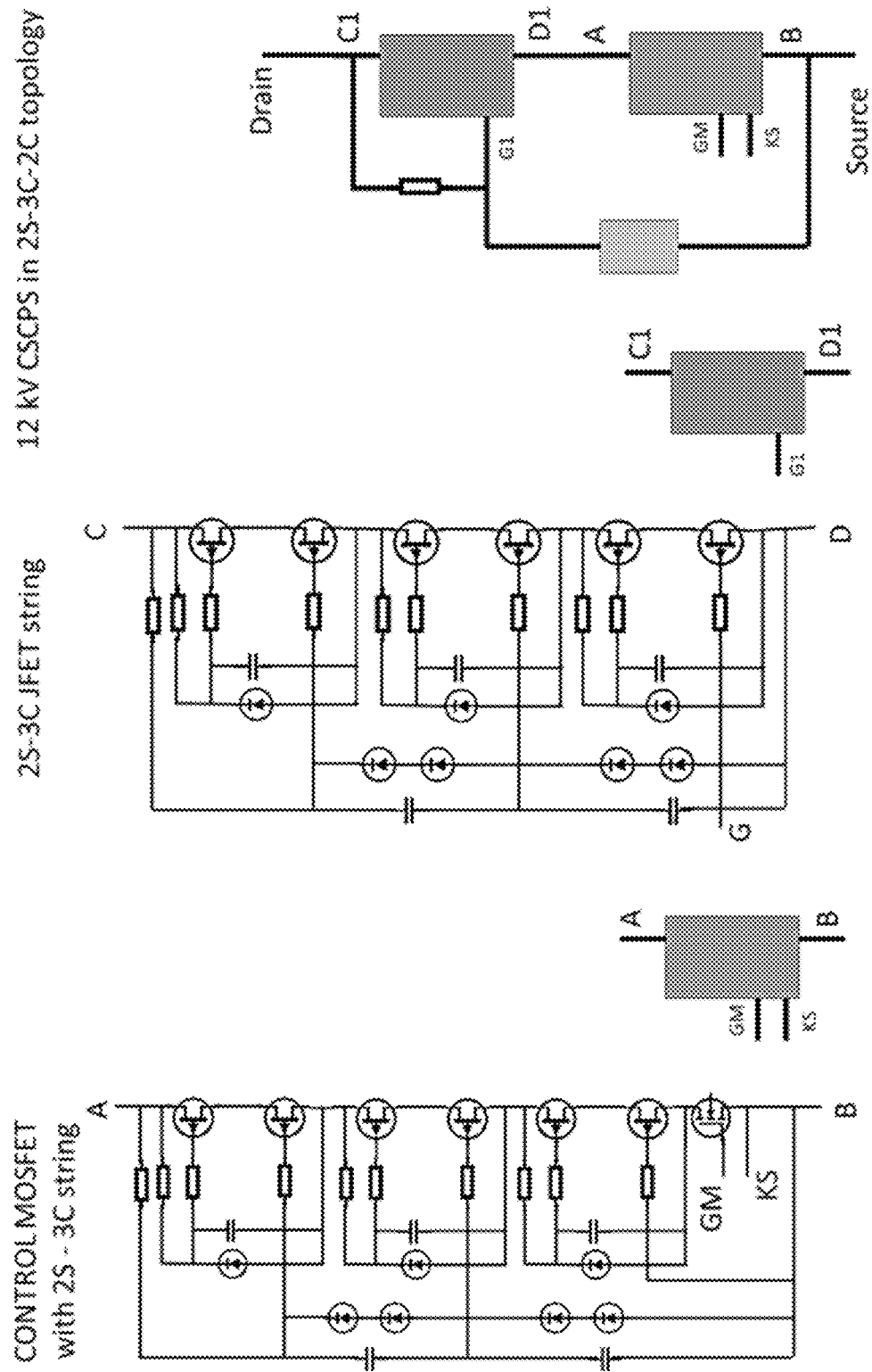
Figure 2D:
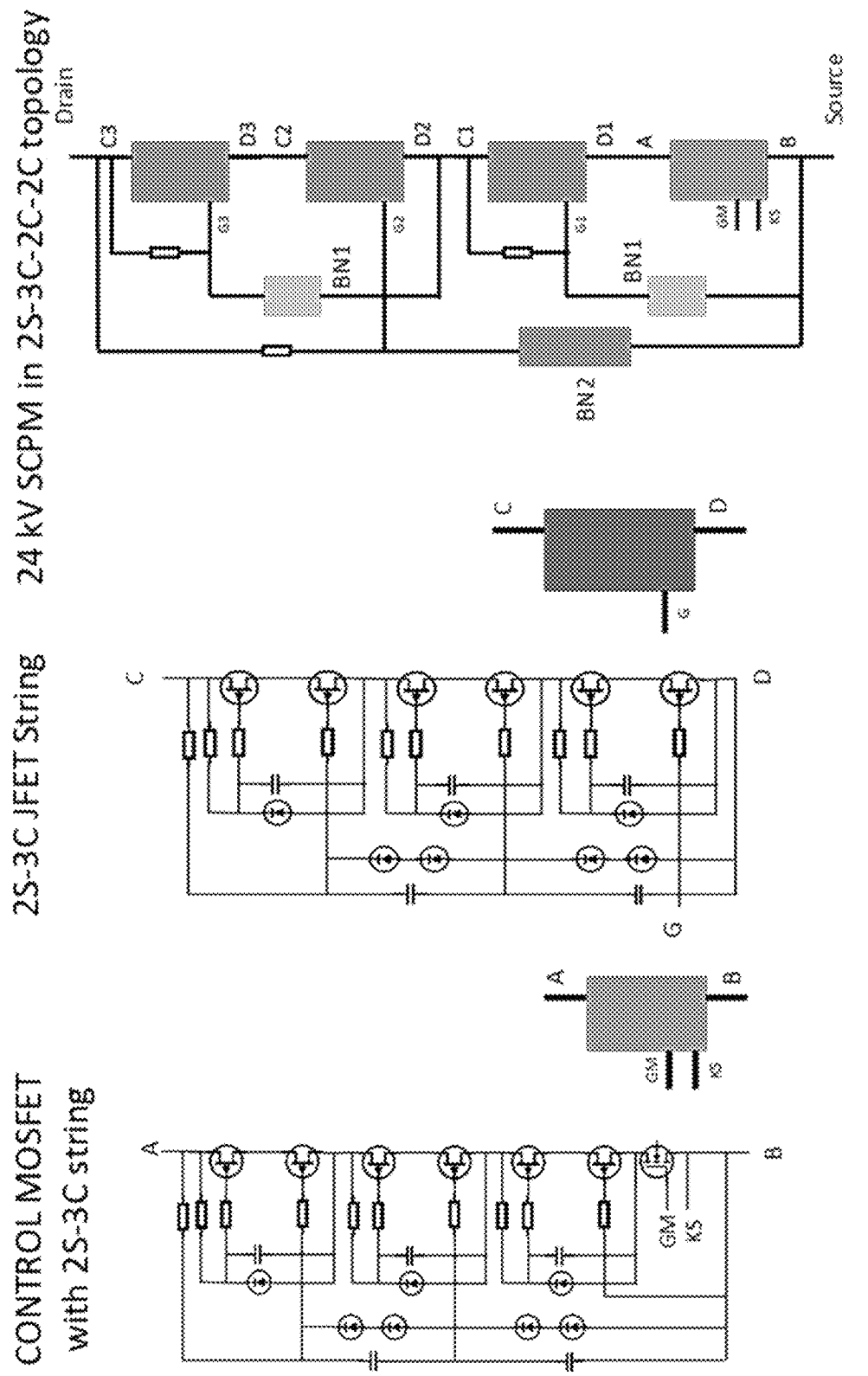

This design can be extended to form multi-layered cascades. For example, a 2-Layer CSC for 12 JFETs can use two of the single-layer CSC of FIG. 2B with another, encompassing, outer or external balancing (or optimizing) network. A 4-Layer CSC for realizing a 24 JFET switch can use two 2-Layer CSCs and yet another, encompassing, outer or external balancing (or optimizing) network; and so on. If 1.2 kV/100 A JFETs were used, then conservatively rated 6 kV/100 A, 12 kV/100 A and 24 kV/100 A switches can be created. Schematic for a 12 JFET 2S-3C-2C CSC and 24 JFET 2S-3C-2C-2C CSC is shown in FIGS. 2C and 2D, respectively.

Optimization and Mathematical Modeling

Multiple CSC structures are possible for any N number of JFETs. Let m be the number of JFETs in series forming a USC and n be the number of USCs connected in series forming a CSC. Each USC can have two or more normally-on devices (e.g., JFETs) with an internal balancing network. For any N JFET SuperCascode, multiple whole number values of m and n can exist as long as it satisfies the following relationship:

$$mXn = \frac{V_S}{V_{DS}} = N, \tag{1}$$

where, $V_S$ is the switch rated voltage, $V_{DS}$ is the per JFET blocking voltage. The multiple permutations of m and n are compared for minimum balancing capacitor size (equivalent to charge) and balancing network switching loss. The net charge requirement, Q for the CSC balancing network can be represented in Equation (2) and the net balancing switching loss, $E_b$ is represented in Equation (3).

$$Q = \left(n * \sum_{j=1}^{m-1} j*(Q_G - Q_D)\right) + \sum_{k=1}^{n-1} \frac{k*(Q_G - Q_D)}{m} \quad (2)$$

$$E_b = \frac{1}{4} * m * n * (Q_G - Q_D) * V_{DS} * (n+m-2) \quad (3)$$

The $Q_G$ is gate-to-source JFET charge at rated $V_{DS}$ and $Q_D$ is anode-cathode diode charge. Equations (2) and (3) together can be utilized to compare different permutations. For UJN1202z (USCi) JFET and AU1PK avalanche diode, TABLE I compares 4 possible permutations to showcase the improvement offered by the optimization of the 2S-3C switch.

TABLE I

Possible Permutations for a 6 JFET CSC Structure

| Design Combinations | | Balancing | Charge | Switching Times | |
|---|---|---|---|---|---|
| JFETs in USC (m) | USCs in series (n) | Network Loss (mJ) | requirement (nFV) | Turn-on time (ns) | Turn-off time (ns) |
| 1 | 6 | 2.25 | 4500 | 316 | 184 |
| 3 | 2 | 1.35 | 2100 | 33 | 84 |
| 2 | 3 | 1.35 | 1800 | 33 | 84 |
| 6 | 1 | 2.25 | 4500 | 316 | 184 |

The component selection and placement of the passive balancing components for the 2S-3C CSCPS of FIG. 2B were optimized for switching speed. The topology has 2 JFETs in a USC with 3 identical USCs in series, and with a Layer 1 balancing capacitor. The balancing circuit comprises:

Clamping diodes (or avalanche diodes), $D_1$-$D_7$ that limit the $V_{DS}$ of the JFETs to an avalanche voltage, $V_{aval}$.

Balancing capacitors, $C_1$-$C_5$ and resistors, $R_1$-$R_6$ control the switching slew rate. Internal to the USC, Capacitor $C_3$ fixes the gate potential of $J_5$ for a limited time leading to synchronous switching of $J_6$ and $J_5$. Similarly, $C_5$ synchronizes switching of USC-3 and USC-2 and so on.

Resistors, $R_{L1}$-$R_{L4}$ control leakage current through avalanche diodes to maintain equivalent turn-off blocking voltages across each JFET.

Figure 2E:
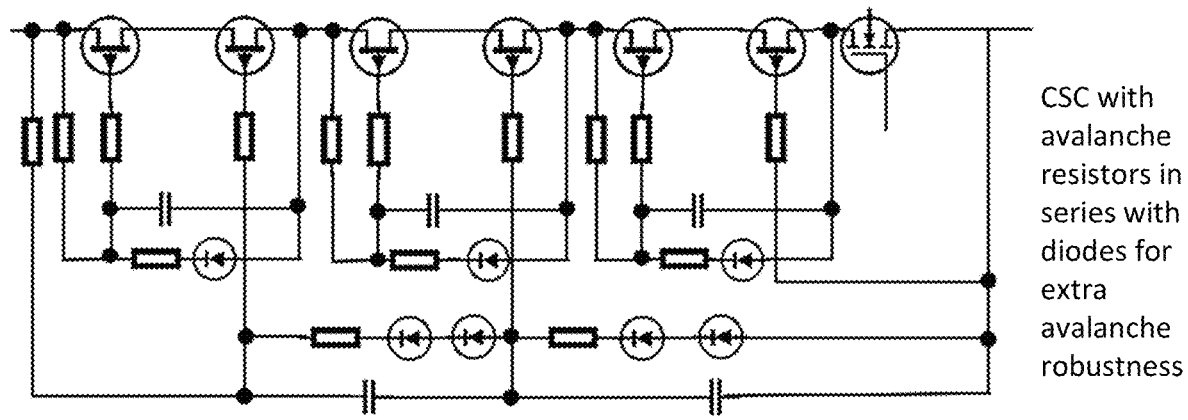

An alternative placement of the passive balancing components for the 2S-3C CSCPS is shown in FIG. 2E optimized for avalanche robustness. Here, an additional resistor is placed in series with the clamping diodes to divert current into the JFET gate.

Figure 3A:
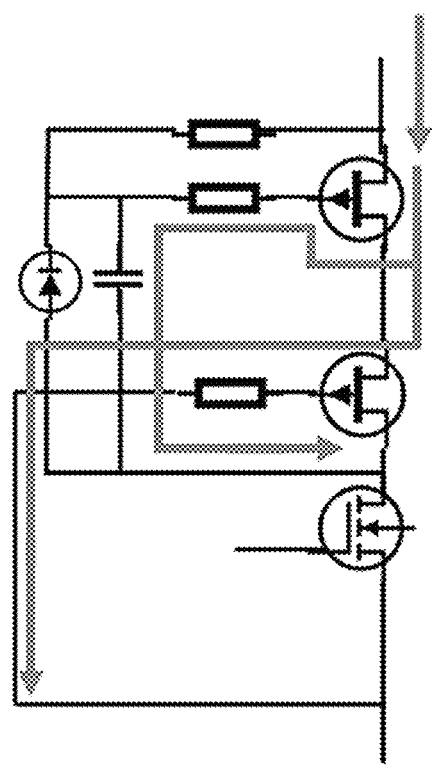

CSCPS turn-off process. The turn-off process of the CSCPS has six stages of deactivation. The first stage begins when a control signal turns off the Si MOSFET, $Q_1$. As the drain-to-source voltage, $V_{dSQ1}$, of $Q_1$ increases, the gate-to-source voltage $V_{gsj1}$ of the depletion-mode JFET, $J_1$, increases. As $V_{dSJ1}$ increases $C_1$ is charged through $C_{issJ2}$ reducing $V_{gsJ2}$. When $V_{gsJ2}$ is lower (more negative) than $V_{th}$, $J_2$ turns off. Then $V_{dSJ2}$ starts to increase. This stage ends. The capacitor charging paths for the first stage are shown in FIG. 3A.

Figure 3B:
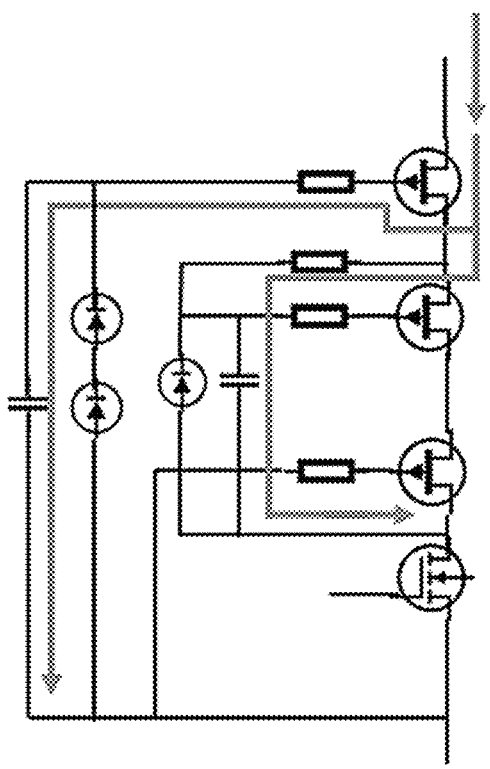

The second stage begins when $J_2$ turns off and $V_{dSJ2}$ begins to increase. When $V_{dSJ2}$ increases, $C_1$ is charged through $C_{issJ2}$. The ratio between $V_{dSJ1}$ and $V_{dSJ2}$ is determined by $C_1$. As $V_{dSJ2}$ increases, $C_4$ is also charged through $C_{issJ3}$, driving $V_{gsJ3}$ more negative. When $V_{gsJ3}$ is lower than $V_{th}$, $J_3$ turns off. When $V_{gsJ3}$ is lower than $V_{th}$, $J_3$ turn off. When $V_{dSJ3}$ begins to increase this stage ends. The capacitor charging paths are shown in FIG. 3B. The third and fifth stages of deactivation are similar to the first stage, and the fourth stage is similar to the second stage. In the sixth stage, when $J_6$ turns off, $V_{dSJ6}$ starts to increase. The $V_{dsCSC}$ reaches its blocking voltage that is applied to the CSCPS and completes the turn-off process.

When the drain-to-source voltage of a JFET increases to an avalanche threshold of the avalanche diode, the diode begins to conduct with a large power loss. In a converter, series-connected switch voltage imbalance, leakage inductance, surge, etc., can all put power switches under avalanche conduction. For the CSCPS, the static per JFET voltage is defined by the avalanche diodes, which breakdown when the per-stage voltage increases to the avalanche condition. The relatively small size of the avalanche diodes in comparison to the JFET make them less capable of absorbing avalanche energy. To increase avalanche robustness, a resistor can be added in series with the avalanche diode to divert avalanche current from diodes to JFETs.

However, when the avalanche voltage is higher than the maximum drain-source voltage, $V_{dsmax}$ of the CSCPS, JFET $J_6$ suffers from drain-gate junction avalanche because the gate of $J_6$ is connected to the CSCPS source, which is the virtual ground for the switch. A gate resistor, $R_6$ limits the maximum current flowing through the drain-gate junction, forcing the drain-source junction to absorb the majority of avalanche breakdown energy, not the diode. The higher the gate resistance, the slower the JFETs switch which increases switching loss.

CSCPS turn-on process. The turn-on process of the CSCPS has six stages for reactivation. The first stage begins when the MOSFET, $Q_1$ turns on and the drain-to-source voltage, $V_{dSQ1}$ decreases. The blocking voltage of $J_1$ to $J_6$ increases to compensate for the decrease of $V_{dSQ1}$. As $V_{dSQ1}$ decreases, $V_{gsJ1}$ increases turning $J_1$ ON when $V_{gsj1}$ is higher than $V_{th}$. Then $V_{dSJ1}$ decreases and the blocking voltage of $J_2$ to $J_6$ increases. As drain-source voltage $V_{dSJ1}$ decreases, capacitors $C_1$ and $C_{d1}$ are discharged increasing $V_{dSJ2}$ as shown in FIG. 4A. When $V_{dSJ1}$ starts to decrease, the stage ends.

The second stage begins when $J_2$ turns ON and the drain to source voltage, $V_{dSJ2}$ starts decreasing. To compensate for the decrease in $V_{dSJ2}$, the blocking voltage of $J_3$ and $J_6$ increases. As VdsJ2 decreases, capacitors C2 and Cd2 are discharged increasing VdsJ3. When $V_{dSJ2}$ decreases and $V_{dSJ3}$ increases the second stage ends. Discharge of $C_2$ and $C_{D2}$ is shown in FIG. 4B. The third and fifth stages are similar to the first stage, and the fourth stage is similar to the second stage. The final sixth stage starts when $J_6$ turns ON and $V_{dSJ6}$ decreases. The entire CSCPM turns on and $V_{dsCSC}$ reaches near zero. Any overshoot normally occurs on $V_{dSJ6}$, so $J_6$ is first to fail.

Simulation Verification. To approximate the performance of 2S-3C CSCPS, a simulation in LTSpice was performed with UnitedSiC's (UJN1202z) JFET model. The QG for the device is 285 nC and for a target $V_{DS}$ of 1 kV, the capacitances $C_1$=$C_2$=$C_3$=285 pF, $C_4$=142 pF and $C_5$=285 pF. The resistance $R_{L1}$-$R_{L4}$=1 MΩ and $R_1$-$R_6$=10Ω, the $D_1$-$D_7$ are Vishay AU1PK avalanche rectifiers. Voltage distributions across individual JFETs in a 2S-3C CSCPS structure are shown in FIG. 5.

Simulation results show $T_{on}$=33 ns and $T_{off}$=84 ns. The switch reported voltage rise and fall time in 71.4 and 181 V/ns and current rise and fall time in 1.51 and 0.79 A/ns. With an additional 10 kΩ resistor in series with the avalanche diode in the avalanche robust structure simulations showed 87% avalanche energy is diverted to the JFETs from the avalanche diodes as a function of avalanche and gate resistors. These can be tailored to increase avalanche capability and short circuit withstand, but sacrifice switching speed.

CSCPS Balancing Network Determination

As previously discussed, the balancing capacitors in the network define the voltage distribution among the individual JFETs in the voltage balancing circuit. The capacitor capacitance can be fine-tuned to synchronize switching and ensure equal dissipation of power in all JFETs in the string. Capacitance optimization can reduce the avalanche loss of the diodes, reduce switching loss during transients and JFET voltage overshoot.

The inputs for the model include gate charge of JFET, $Q_g$ ($Q_{gd}+Q_{gs}$), anode-cathode charge of avalanche diode, $Q_D$; CSC power switch rated voltage, $V_R$; JFET gate threshold voltage, $V_{th}$ and JFET drain-source rated voltage, $V_{DS}$. It is assumed N is the number of JFETs in the CSCPS, m is the number of JFETs in a USC and n is the number of USCs forming a CSCPS.

Step 1: The number of JFETs are determined using the CSCPS rated voltage and JFET rated voltage:

$$N = \frac{V_R}{V_{DS}}, \quad (4)$$

Step 2: The factors of N are represented as $x_1, x_2, \ldots x_n$. For a single layer CSC PS, two factors are then selected in permutations and represented as m and n such that:

$$N=m*n, \quad (5)$$

For a two-layer CSCPS, three factors are selected in permutations represented as m, n and o, and repeated:

$$N=m*n*o, \quad (6)$$

Here, m is the number of JFETs forming a USC, n is the number of USCs connected in the 1st CSC layer to form a CSCPS and o is the number of CSCPS connected in series and powered at the 2nd layer.

Step 3: The USC internal capacitance is then determined. For an m JFET USC, m−1 capacitors are needed and capacitors scale starting from the top most capacitor, $C_1$, $$C_m = m * \frac{Q_D - Q_G}{V_{DS}}. \quad (7)$$

Starting at the topmost capacitor, $C_1$, i.e., the capacitor at the highest voltage potential relative to ground, scales as $C_m=m*C_1$ where m is the JFETs in an USC. As an example, let $Q_G=300$ nC, $Q_D=30$ nC, m=3 each JFET blocks 1 kV. Using Equation (7), $C_1=270$ pF and $C_2=540$ pF.

Step 4: For a single layer CSCPS, the external balancing capacitance is then determined using Equation (8). For a circuit with n USCs forming a CSCPS, n−1 capacitors are required and scale with n starting from the topmost capacitor, $C_{11}$.

$$C_{n1} = \frac{1}{(m-1)} * \left(\frac{Q_D - Q_G}{V_{DS}}\right), \quad (8)$$

Starting at the topmost capacitor, $C_{11}$, i.e., the capacitor at the highest voltage potential relative to the ground, scales as $C_{n1}=n*C_{11}$, where n is the number of USCs forming a single layer CSCPS. As an example, let $Q_g=300$ nC, $Q_d=30$ nC, n=3, m=3 and each JFET blocks 1 kV. Using Equation (8), $C_{11}=135$ pF and $C_{21}=270$ pF.

Figure 6:
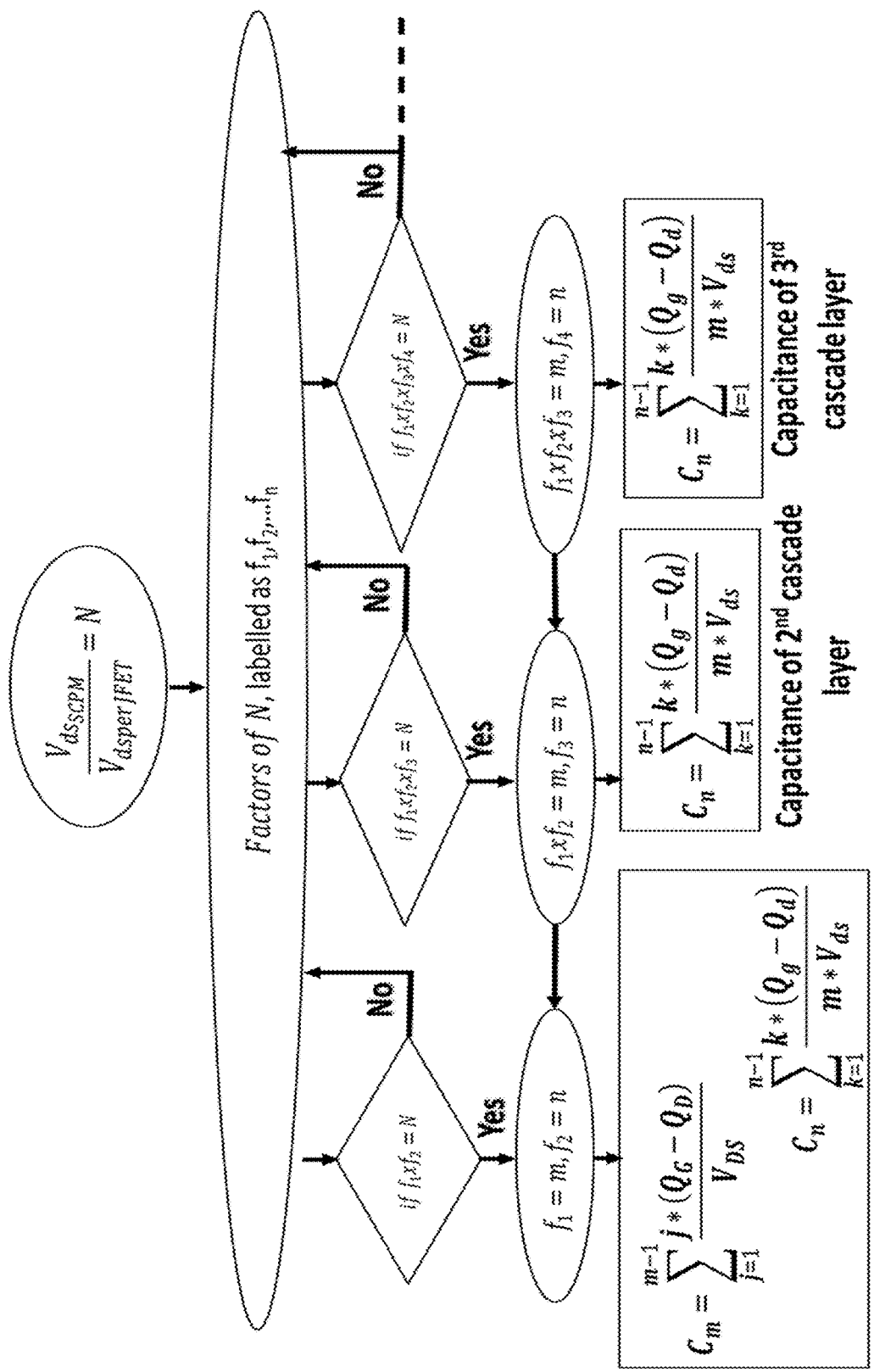
FIG. 6 is a flowchart illustrating the determination of the balancing (or optimizing) network capacitors, in accordance with various embodiments of the present disclosure.

The net capacitance requirement for a N-JFET multi-layer CSCPS can be determined using the flowchart shown in FIG. 6. The flowchart can be used to determine the net capacitance for an n-th layer CSCPS and net capacitance internal to a USC.

Case Studies

The first case study discusses the effect of capacitance tolerance in the USC and 1st layer CSCPS on the voltage sharing across JFET. In the OFF state, $C_1$ is charged. To turn ON the SCPS, $Q_1$ is turned on by applying a gate voltage greater than the threshold voltage. When $Q_1$ turns on the $J_1$ gate-source voltage decreases. When it reaches pinch-off, $J_1$ starts to conduct and the source potential of $J_2$ starts decreasing. Capacitor $C_1$ fixes the potential for a limited time such that the gate voltage of $J_2$ increases as soon as the source potential decreases. Thus, proper sizing of $C_1$ will synchronize JFET turn-on and turn-off.

Figure 7:
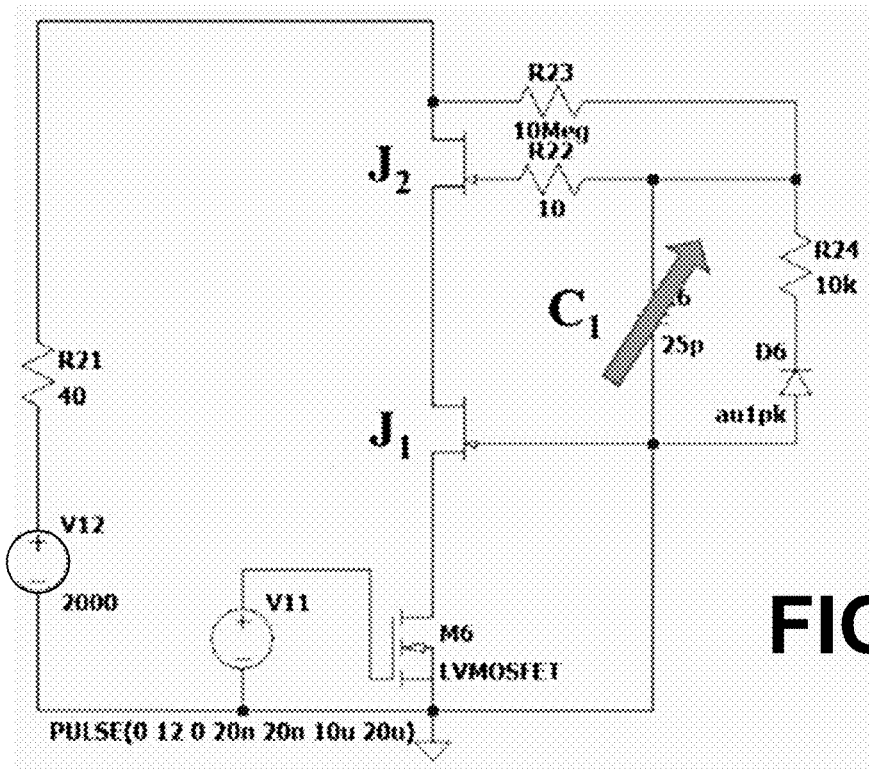
FIG. 7 is an LTSpice schematic of a 2 kV USC, in accordance with various embodiments of the present disclosure.
Figure 8A:
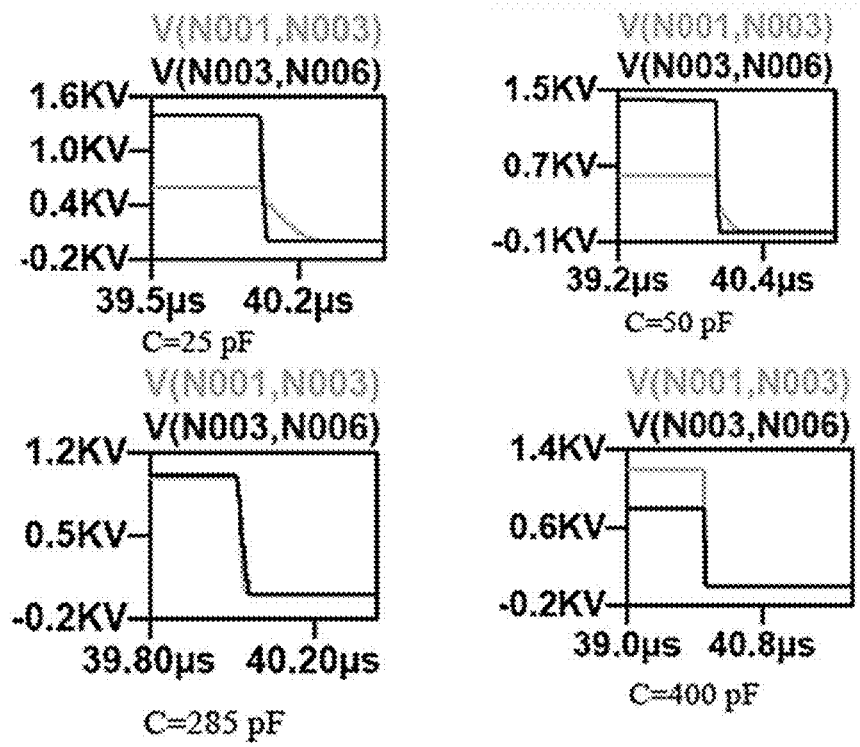
FIGS. 8A and 8B illustrate examples of drain-to-source voltage and switching transients across the serial JFETs under varying balancing capacitances, in accordance with various embodiments of the present disclosure.
Figure 8B:
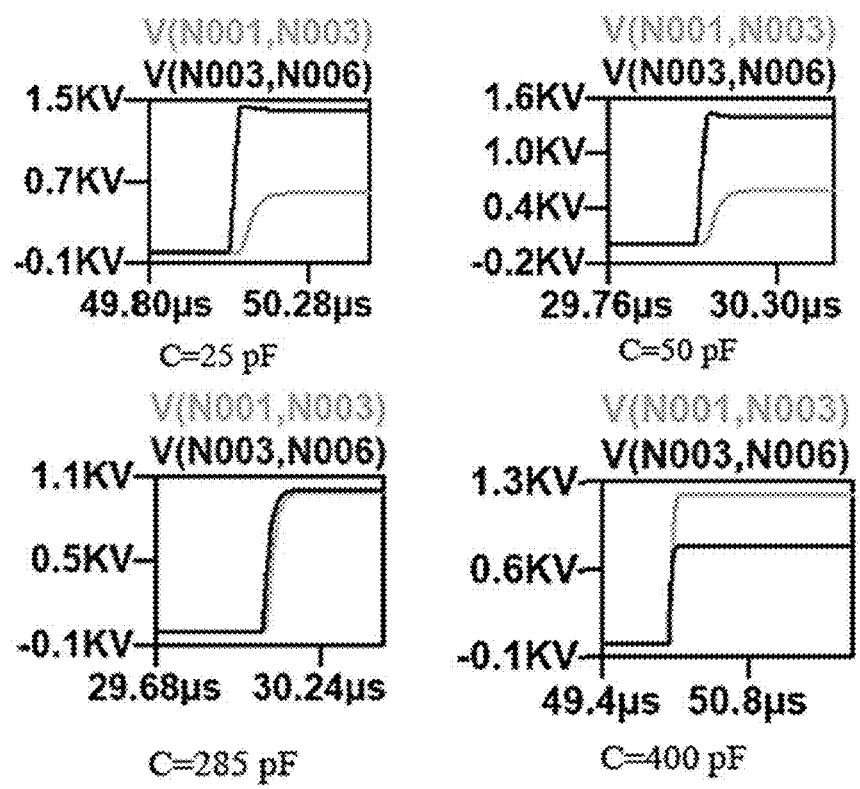
Figure 9A:
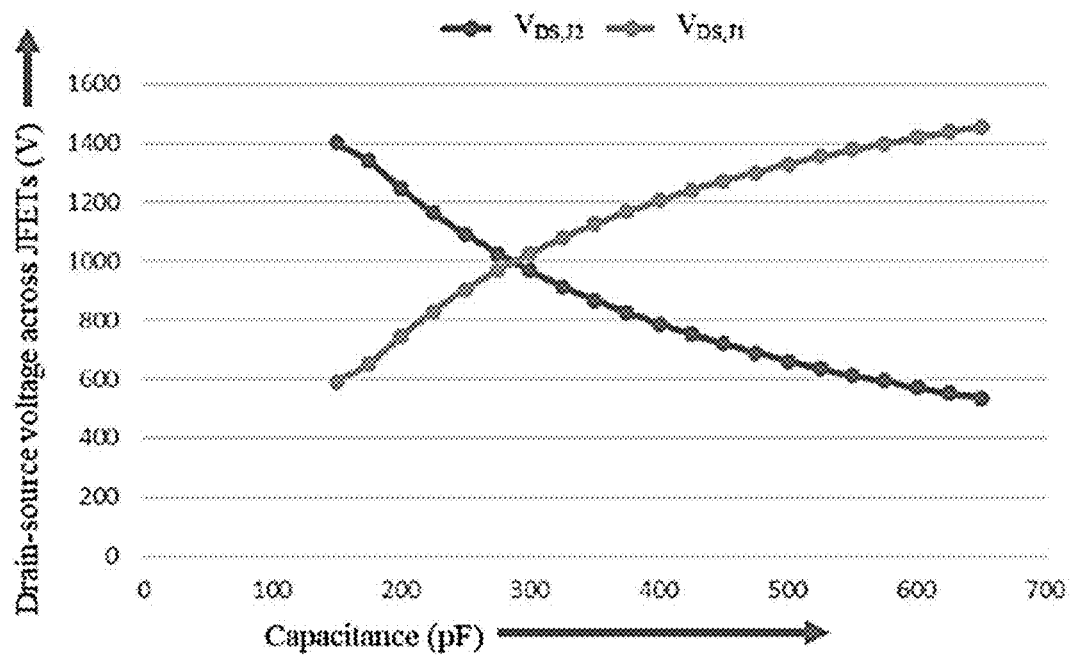
FIGS. 9A and 9B illustrate examples of characteristics across JFETs vs capacitance, in accordance with various embodiments of the present disclosure.
Figure 9B:
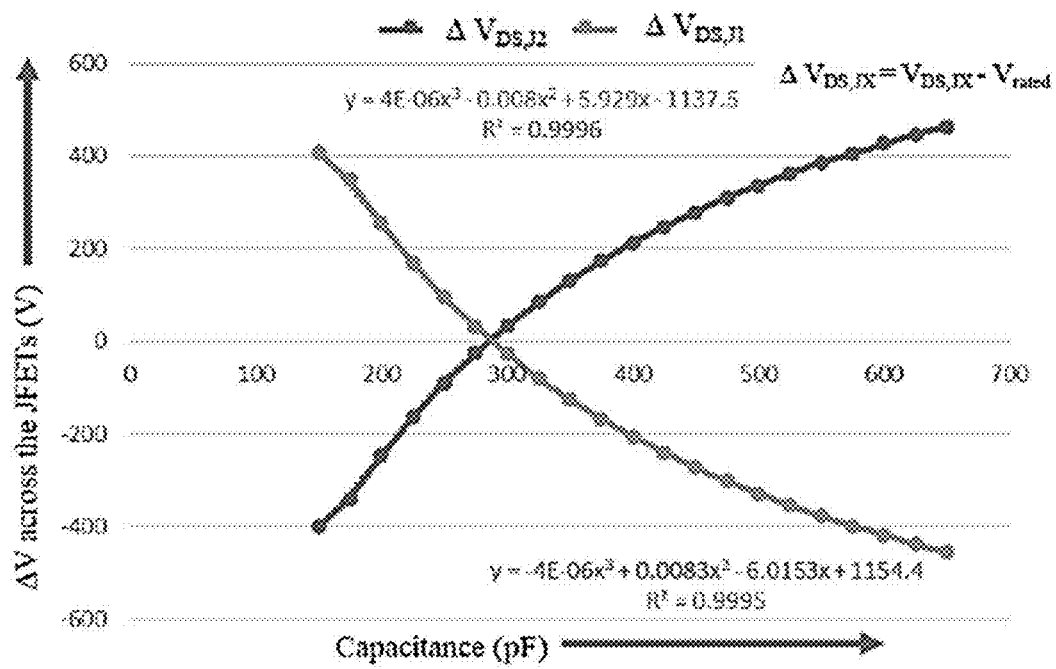

A 2 kV USC was chosen and shown in the schematic diagram of FIG. 7 for simplification. $C_1$ was varied from 25 pF to 400 pF in 25 pF steps. Simulation results showing the turn-on and turn-off switching transient for $C_1$ is shown in FIGS. 8A and 8B, which illustrate examples of drain-to-source voltage and switching transients across the serial JFETs under varying balancing capacitances (V(N001, N003) trace for $V_{ds}$ of $J_1$, V(N003,N006) trace for $V_{ds}$ of $J_2$). The plot of drain-to-source voltage across JFETs versus varying balancing capacitance and peak overshoot ($\Delta V_{ds}$ across JFETs) versus varying balancing capacitance is shown in FIGS. 9A and 9B, respectively.

The results show that with increasing capacitance value, greater synchronization in JFETs of the SC can be achieved which manages the blocking capability of the serial JFETs. However, a large value of $C_1$ results in a more synchronous switching operation, but an unbalanced voltage distribution as shown in FIG. 8A. The trend of voltage difference across JFETs vs capacitance can be represented by the following polynomial expression:

$$\Delta V_{DS,J1} = -4*10^{-7}C^3 + 0.0083C^2 - 6.0153C + 1154.4 \quad . (9)$$

Note, the trend is valid for the UJN1202z JFET and any variation in $Q_{GS}$, $Q_{DS}$, transconductance, etc. alters the trend.

Tackling Practical Challenges in CSCPS Scaling

In the SC structure, a non-synchronous turn-off causes over-voltages of the upper JFETs particularly, for example, in case of hard commutation of a diode in a bridge leg. Key causes can be device internal tolerance (i.e., varied gate resistances, gate charge, etc.) stray parasitics which limit a specific JFET switching rate and improper balancing network design.

Unequal Power and voltage dissipation. There is a tradeoff between switching power dissipation in each JFET and the OFF-state blocking voltage of the CSCPS. Devices in a CSCPS are sequentially triggered from $J_6$ to $J_1$ in FIG. 2B. When a device blocks equivalent voltage during sequential turn-off, a slight delay occurs between triggering $J_1$ and $J_6$, which causes JFETs in lower stages (i.e., $J_6$) to dissipate more power than JFETs in upper stages (i.e., $J_1$) during switching as shown in TABLE II when each device blocks equivalent voltage.

TABLE II

Simulated switching energy loss and blocking voltage of serial JFETs in CSCPS

| JFET | Blocking voltage equated | | Targeting equivalent power dissipation | |
|------|--------|----------|--------|----------|
|      | $E_{SW}$ | $V_{OFF}$ | $E_{SW}$ | $V_{OFF}$ |
| J1   | 0.21 mJ | 942 V  | 0.37 mJ | 1152 V |
| J2   | 0.32 mJ | 980 V  | 0.44 mJ | 1120 V |
| J3   | 0.42 mJ | 1010 V | 0.48 mJ | 1041 V |
| J4   | 0.55 mJ | 1014 V | 0.48 mJ | 1015 V |
| J5   | 0.61 mJ | 1011 V | 0.56 mJ | 915 V  |
| J6   | 0.85 mJ | 1023 V | 0.61 mJ | 757 V  |
| M1   | 0.01 mJ | 20 V   | 0.01 mJ | 20 V   |

To tackle this, it is possible to fine-tune the balancing capacitors using the balancing network determination Equations (4)-(8) to block different voltage rating per JFET in CSCPS string such that each device dissipates the same amount of power. For example, by allowing $J_1$ to block 395 V more than $J_6$, the change in power dissipation can be reduced from 0.21-0.85 mJ to 0.37-0.61 mJ. Further reduction is possible by using >1.2 kV devices and scaling the upper stage device blocking capability as string size increases.

Parasitic capacitance and Inductance. Unwanted parasitic circuit capacitances adding to $C_{oss}$ and $C_{gs}$, or tolerance variations in the device pinch-off voltage, $V_{p-o}$, can affect the serial triggering of devices but can be adjusted by modifying the balancing network capacitance as shown in Equation (10), where $\Delta V$ is the per JFET blocking voltage.

$$\Delta C = (\Delta C_{gs} + \Delta C_{OSS}) \frac{\Delta V_{p-o}}{V_{p-o}}. \quad (10)$$

Here, $\Delta$ is change in capacitance and voltage due to tolerance and parasitics. Similarly, parasitic inductance in the CSCPS limits the rate at which the JFET is charged and discharged causing a time delay, $t_d$.

$$t_d = \frac{I_{gs}}{L_{par}} * V_{p-o} \quad (11)$$

This delay can cause loss of synchronization in sequential triggering and scales with the number of devices in the serial string. To compensate, gate resistors and balancing networks can be fine-tuned to adjust the RC switching rate.

Extraction of Stray Parasitics, Simulation and Results

Figure 10:
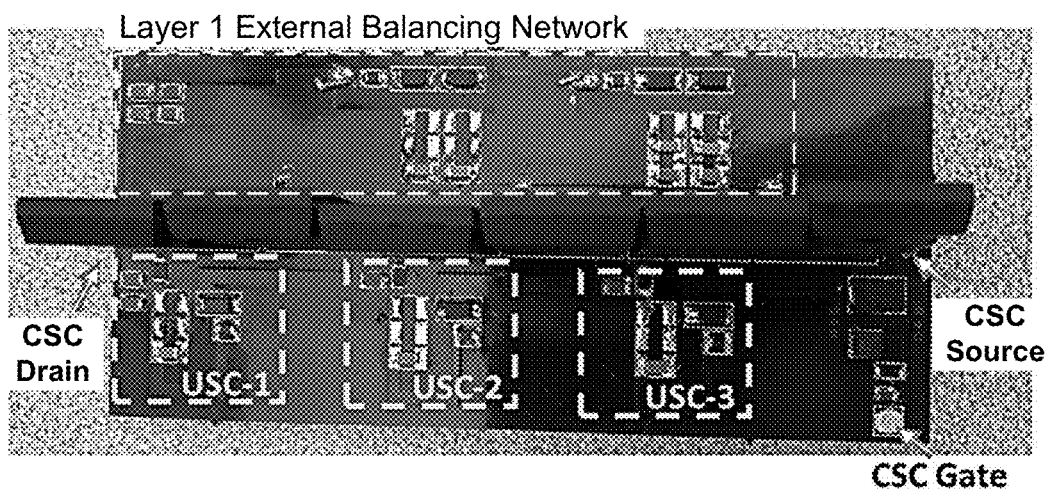
FIG. 10 is an image of a 6.5 kV 2S-3C CSCPS prototype using discrete SiC JFETs on a PCB, in accordance with various embodiments of the present disclosure.
Figure 11:
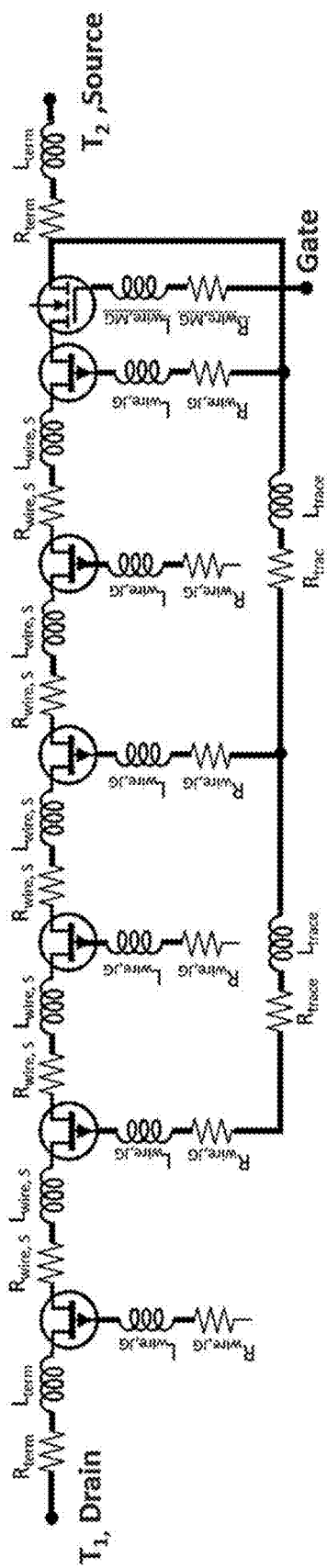
FIG. 11 illustrates the electrophysical component values of a fabricated 6 JFET 2S-3C used for simulation, in accordance with various embodiments of the present disclosure.

A 6 kV 2S-3C CSCPS using UnitedSiC UJN1208K JFETs with a balancing network was fabricated as shown in FIG. 10. An Ansys Q3D simulation to measure the stray parasitics in the PCB and an electro-physical model was developed as shown in FIG. 11, and the component values of the electro-physical model are summarized in the table in FIG. 11. The analytical model enables an optimized design of the CSCPS balancing network design and takes into account the device tolerance and effect of module stray parasitics.

Figure 12:
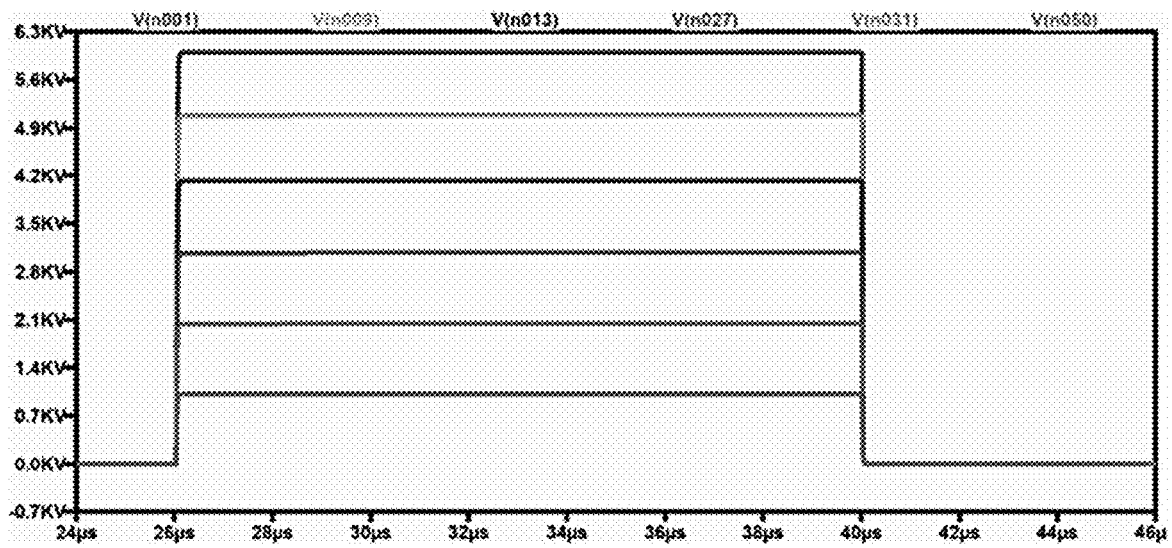
FIG. 12 illustrates voltage across individual JFETs, in accordance with various embodiments of the present disclosure.

To verify the analytical model, an LTSpice simulation with parasitics was performed to verify synchronization in switching and dynamic voltage sharing in the off-state. The simulated turn-on and turn-off switching waveforms for a resistive load, R=120Ω is illustrated in FIG. 5 and the drain-source voltage distribution across individual SiC JFETs in the OFF state at 6 kV operation is shown in FIG. 12, with the voltage across each JFET (V(n001)-V(n050)=$V_{J1}$-$V_{J6}$). The optimized component values are shown in TABLE III.

TABLE III

Optimized balancing network component values

| Component | Values |
|-----------|--------|
| $C_1$-$C_3$ | 285 pF |
| $C_4$ | 155 pF |
| $C_5$ | 310 pF |
| $R_{L1}$-$R_{L3}$ | 5 MΩ HV |
| $R_1$ | 10.5 Ω |
| $R_2$ | 11 Ω |
| $R_3$ | 11.25 Ω |
| $R_4$ | 11.5 Ω |
| $R_5$ | 11.75 Ω |
| $R_6$ | 12 Ω |

The fabricated CSCPS was tested. The forward IV characteristics showed the device has an $R_{ds(on)}$ of 408 mΩ and a static reverse leakage current of 0.7 mA@4.8 kV which conformed to the MOSFET and JFET datasheet. The switch under DPT testing at 4 kV/50 A operation reported a 23 ns current rise and 50 ns current fall time using 90% to 10% transition. The techniques can alter capacitance size to develop an optimized structure for an application. Comparison of the CSCPS with other state of art solutions at the 6 kV voltage range and equated current rating is shown below in TABLE V.

Experimental Results

A 6 kV 2S-3C CSCPS was fabricated using six discrete TO-247 UnitedSiC UJN1208K JFETs with a balancing network as shown in FIG. 10. The component values of the balancing network are shown in TABLE IV.

TABLE IV

Component values for 6.5 KV CSCPS

| Component | Values |
|-----------|--------|
| $C_1$-$C_3$ | 68 pF, 1 kV rated |
| $C_4$ | 34 pF, 2 kV rated |
| $C_5$ | 68 pF, 2 kV rated |
| $R_{L1}$-$R_{L3}$ | Vishay 4 MΩ high voltage |
| $R_1$-$R_6$ | Vishay 10 Ω high power |
| $D_1$-$D_7$ | Vishay AU1PK |

Figure 13A:
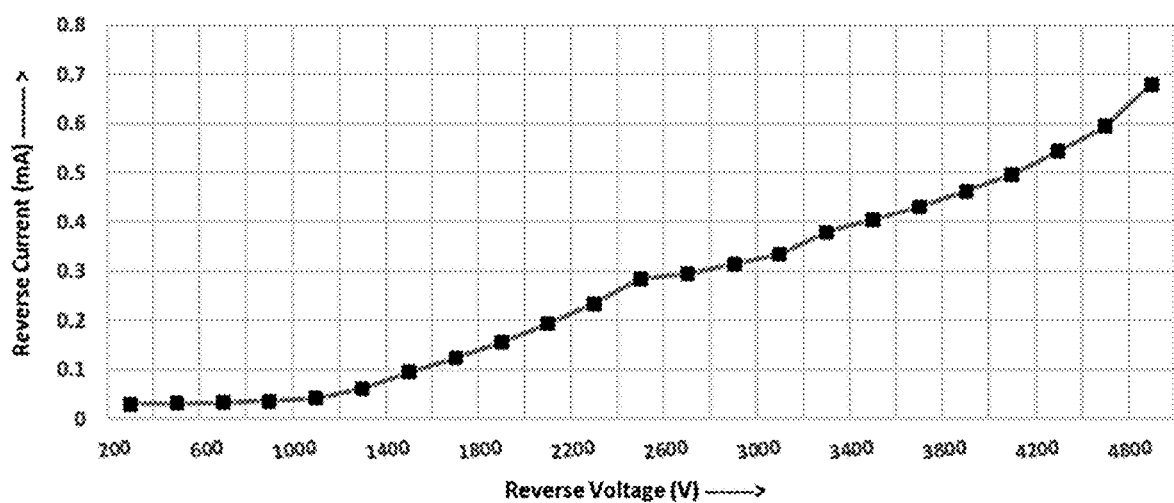
FIGS. 13A and 13B illustrate operational characteristics of the CSCPS, in accordance with various embodiments of the present disclosure.
Figure 13B:
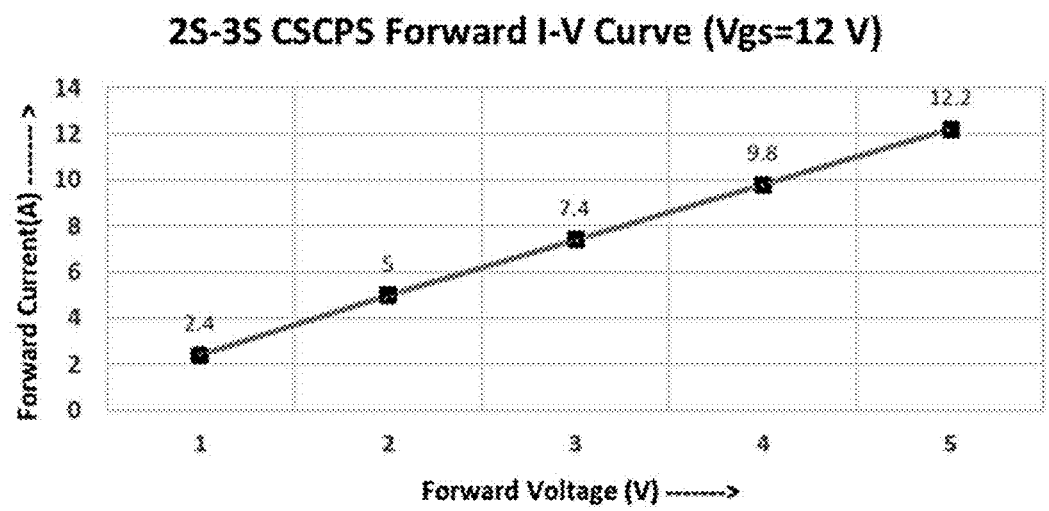

The device was put through static electrical testing in the first and third quadrant to characterize the power switch before performing dynamic tests in a Double Pulse Test (DPT) configuration. FIGS. 13A and 13B shows examples of the 2S-3C CSCPS reverse blocking characteristics and the CSCPS forward I-V curve. The forward I-V characteristics in FIG. 13B shows the device has an $R_{ds(on)}$ of 408 mΩ. This value conforms to the datasheet value of the UJN1208Z (typical 67 mΩ/device) and the MOSFET (0.9 mΩ). The reverse I-V characteristics shown in FIG. 13A, shows a static reverse leakage current of 0.7 mA@4.8 kV which conforms to the datasheet maximum drain leakage current.

A DPT test setup was built for dynamic switching performance of the CSCPS. The DPT setup comprised a 6 kVdc supply, an 8 μF large decoupling capacitor, 6 mH custom inductor and four 1.7 kV/42 A GeneSiC diodes (GB25MPS17-247) connected in series. The Cypress PSoC 5LP CY85C5888LT1 microcontroller board was used to generate trigger signals. In test, a series of pre-pulses (gate-to-source voltage) were sent before the main pulse to ensure that the DUT's dynamically balanced.

Figure 14A:
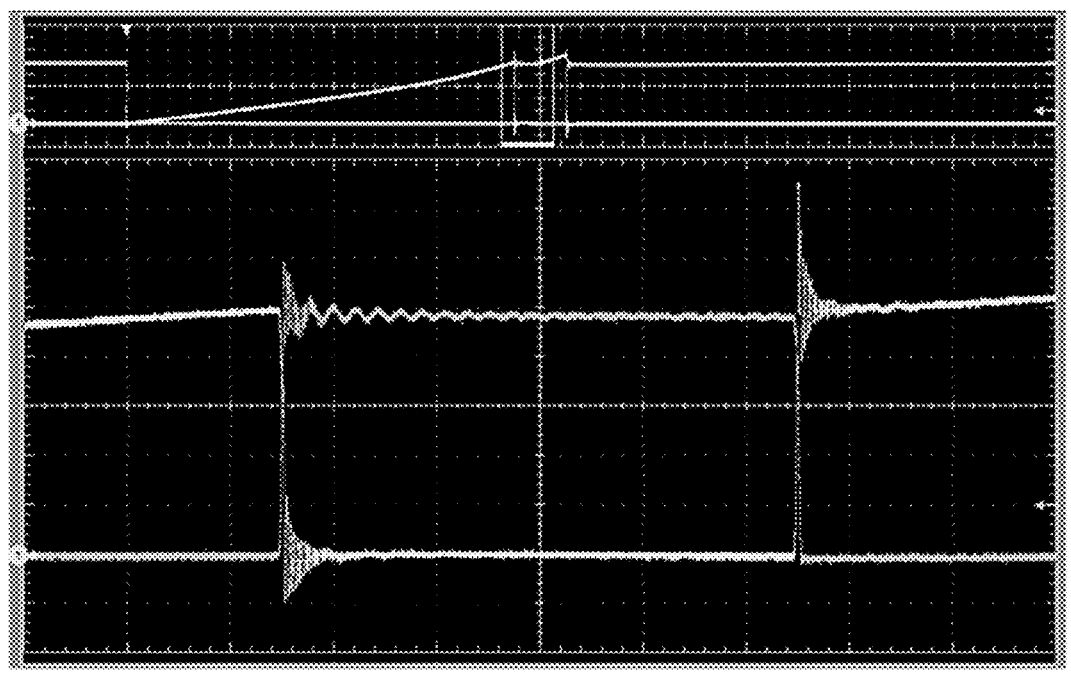
FIGS. 14A and 14B illustrate DPT test waveforms of the CSCPS of FIG. 10, in accordance with various embodiments of the present disclosure.
Figure 14B:
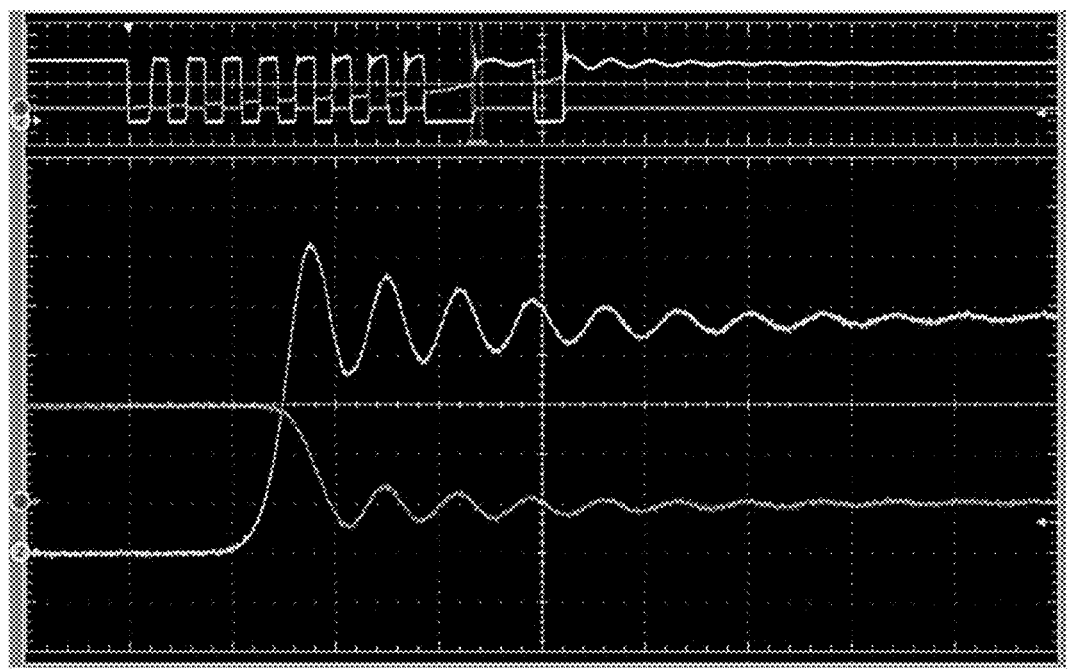

An example of the DPT test results at 4 kV/50 A operation are shown in FIG. 14A and an example of the DPT test results with pre-pulses applied to ensure dynamic balance at 4 kV/100 A operation are shown in FIG. 14B. The switching transition times using the 90%-10% basis transition were calculated. The CSCPS exhibited 23 ns current rise and 50 ns current fall. The slower turn-on time compared to simulation results may be attributed to an underestimated power loop inductance. The device shows 40 ns voltage rise time and 55 ns voltage fall time.

The CSCPS has been shown to be scalable from hundreds of volts to tens to hundreds of kilovolts. The design approach can minimize balancing network size, improve switching speed and improve avalanche capability. The power switch was simulated to showcase the improved switching and balancing performance over state-of-art solutions as summarized in TABLE V. A 6.5 kV/21 A 2S-3C CSCPS was fabricated and tested under static and dynamic operation. Switching at 4 kV/50 A the switch rise and fall times were $t_r=23$ ns and $t_f=50$ ns for current and $t_r=40$ ns and $t_f=55$ ns for voltage. The results highlight the effectiveness of wide band gap-based CSC for medium voltage fast transition switching.

TABLE V

Switching time comparison between IGBTs and different SCPMs

| Design | Current $t_r/t_f$ (ns) | Voltage $t_r/t_f$ (ns) |
|---|---|---|
| Si IGBT | ~400/500 | ~400/500 |
| Friedrichs SCPS | 160/240 | 60/80 |
| Dolar SCPS | 161/41 | 31/182 |
| X.Li SCPS | 40/60 | 37/73 |
| Gao SCPS | 45/200 | 45/50 |
| CSCPS | 33/84 | 31/37 |

The example Solid State Circuit Breaker (SSCB) or a solid state circuit protection device, presented in this disclosure utilize the SC structure as the breaking element to interrupt current with the absence of an arc. The SSCBs offer faster actuation, longer life, and flexibility in programmability to fit multiple systems applications as needed in smart grid integration making them favorable over mechanical breakers. Multiple approaches to realizing a SSCB in medium voltage have been proposed though few practical or cost-effective solutions currently exist. A 1000 V SSCB using a 1200 V SiC JFET cascode capable of interrupting 125 A within 2.5 µs has been proposed with attention given to voltage sharing among sequential switches. A 10 kV DC SSCB based on series-connected Press-Pack IGBTs capable of interrupting 5.1 kA within 5.5 ms was proposed for the protection of high voltage DC voltage source converters. A 15 kV/200 A SSCB based on parallel-connected SiC ETOs was demonstrated at 4.5 kV/200 A, however, interruption time was not reported due to low bandwidth of utilized current sensors. A 10 kV SSCB interrupting 1 kA in approximately 5 µs with reliability tested with 10,000 operations at 1 kA was proposed, however only conceptual drawings of the physical breaker and no hardware verification were provided.

Figure 15:
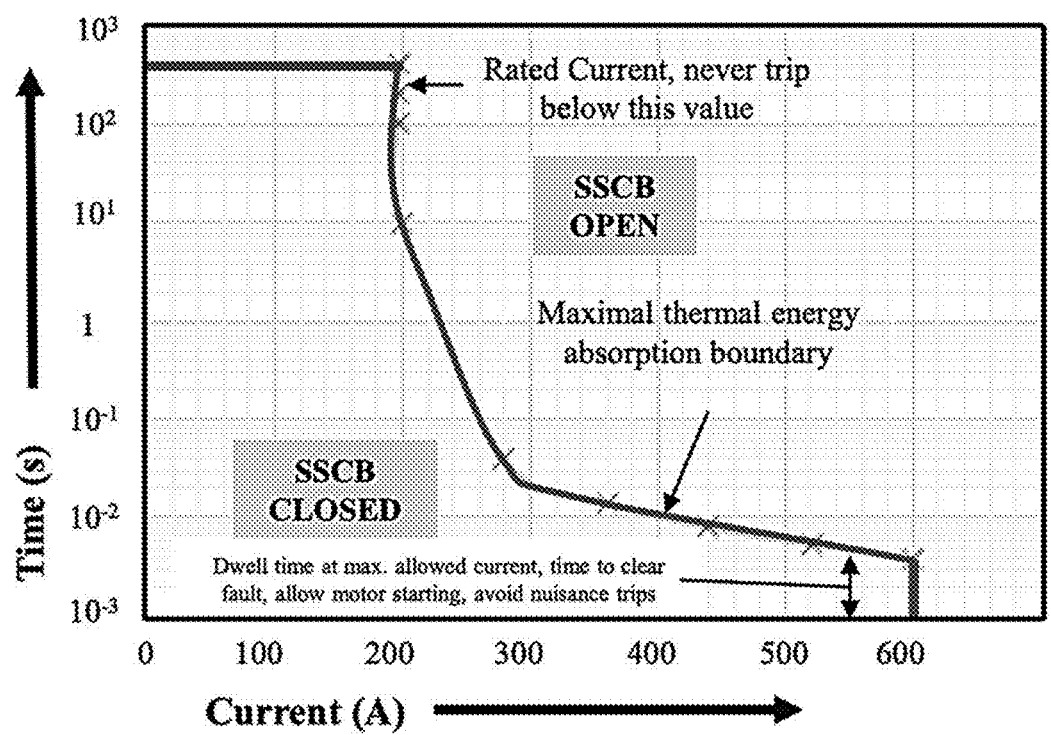
FIG. 15 is an example of a circuit breaker trip curve, in accordance with various embodiments of the present disclosure.

Similar to electric fuses, SSCBs are characterized by a trip curve or $I^2t$ curve designed to protect cabling and sources. However, the curve also defines the thermal energy relationship of the maximum time duration the semiconductor devices can conduct at different current levels constrained by the Safe Operating Area (SOA) of the devices. Unlike the trip curve for a mechanical circuit breaker, the curve represents the operational boundary and not the operating point, and the breaker can be reprogrammed to operate anywhere below the curve and the SSCB must be designed to have fail-safe operation anywhere above the curve. An example of a typical circuit breaker trip curve is shown in FIG. 15. The single-point trip curve shows that a 200 A circuit breaker can be operated to 3× rated current for a 5 ms dwell. This disclosure defines an $I^2t$ trip curve based on the thermal operating points of the power module. The thermal design will now be discussed in detail.

Thermal and Power Module Design

Figure 16:
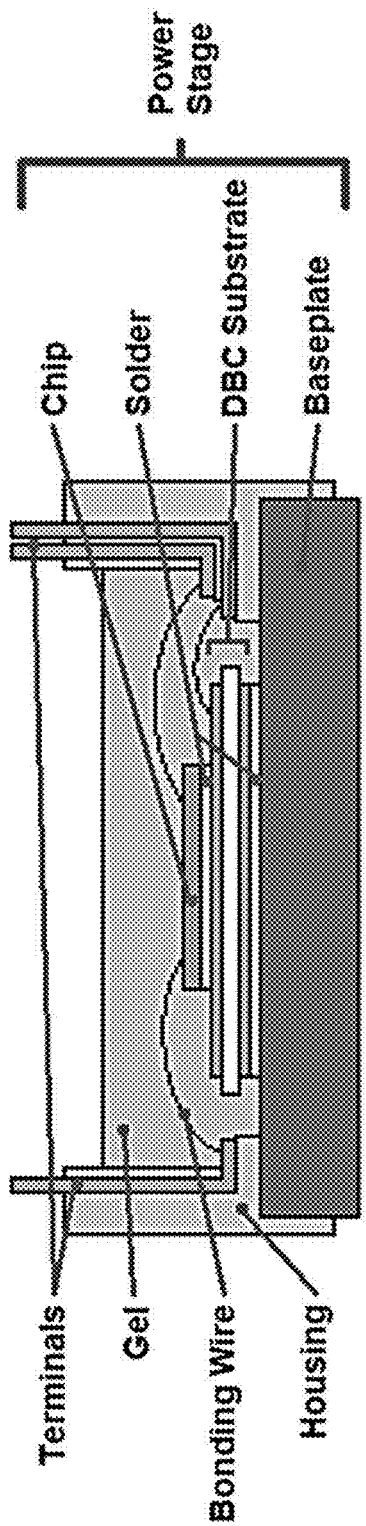
FIG. 16 illustrates an example of a power module structure, in accordance with various embodiments of the present disclosure.

An example of a typical power module structure is shown in FIG. 16. The power module structure is expected to provide mechanical support and a thermal path for heat dissipation. The devices can be attached to a patterned ceramic substrate, the substrate can be mounted onto a metal baseplate and finally a heatsink/heat exchanger can be attached onto the baseplate. Several attachment methods can be employed such as, e.g., solder, sintered silver and metal loaded epoxies depending on application.

Substrate Selection. Copper-clad ceramic substrates, such as Direct-Bonded-Copper (DBC) with aluminum nitride (AlN), aluminum oxide ($Al_2O_3$) or silicon nitride ($Si_3N_4$) can be used in the power modules. The metalloceramic packaging approach is a benchmark with a relatively low coefficient of thermal expansion (CTE) and high thermal conductivity. However, due to the high cost of DBC substrates, industries are seeking cost-effective alternatives. One alternative is a novel ultra-thin Epoxy Resin Composite Dielectric (ERCD), wherein the resin material is filled with $Al_2O_3$ and AlN resulting in thermal conductance comparable to $Al_2O_3$-DBC substrates at one-fourth the cost. Material properties are listed in TABLE VI. Other types of polymer or organic substrates can be used.

TABLE VI

Material properties of polyimide and $Al_2O_3$ substrate

| Parameter | $Al_2O_3$ | ERCD | Units |
|---|---|---|---|
| Thermal Conductivity | 24 | 10 | W/mK |
| $T_g$ | — | 270 | ° C. |
| Modulus | 340 | 30 | GPa |
| CTE | 4.5-7 | 10-17 | ppm/° C. |
| Dielectric Strength | 20/mm | 5.6/120 µm | kV |

The CTE of ERCD is closer to copper (16.7 ppm/° C.), compared with ceramic in traditional DBC (4.5-7 ppm/° C.) and has a superior lower modulus, which is key for better thermal stress management on power modules during fabrication and lifetime usage. ERCD allows up to 250° C. continuous operation making it practicable for high power applications.

Thermal Design. For a SSCB, the semiconductor power module can be designed not only to dissipate nominal conductive thermal energy, but also transient thermal energy generated during a short circuit event. Mathematically, the temperature rise of the devices during a fault is directly proportional to the difference of thermal dissipation of the devices to the thermal absorption and extraction of the module and can be defined by:

$$\Delta T \propto \left( \frac{\int (I^2 Rt) dt}{t} - E_{ext} \right), \quad (12)$$

where the time integral of $I^2Rt$ ($\int(I^2Rt)dt$) is the thermal energy generated in the device assuming constant on-state resistance R and t is the time interval of the short circuit transient. The thermal energy extraction, $E_{ext}$, by the module through the heat sink can be directly proportional to the heat transfer coefficient and the area of cross-section of heat extraction represented mathematically by:

$$E_{ext} \propto hA, \quad (13)$$

where h is the heat transfer coefficient and A is the cross-sectional area of heat extraction. Equations (12) and (13) are fundamental relations used to study transient heat transfer and utilized below in the sample design to define the SSCB fuse curve.

BSSCB Design

Figure 17:
FIG. 17 is a schematic diagram illustrating an example of worst-case faults in a power system, in accordance with various embodiments of the present disclosure.

When a fault occurs in a DC system, the magnitude of the short circuit current and reactive energy is dependent on the point of failure and the cause of the fault. To define breaker design characteristics, it is important to identify the worst-case operating boundaries due to the short circuit current and stored reactive energy. These boundaries drive the design and are defined as Fault-A and Fault-B. FIG. 17 is a diagram illustrating an example of worst-case faults in a power system.

Fault-A represents the worst case, low impedance fault. This occurs at the source where very little resistance or inductance is present, and a high effective capacitance allows for very high di/dt. This condition produces the greatest transient thermal stress while requiring the circuit breaker to actuate and interrupt as fast as possible.

Fault-B represents a highly inductive and capacitive fault current. Such a fault can occur anywhere in the protected system, however the worst case is represented by a fault farthest from the source where the system inductance causes a low di/dt. This type of fault produces the largest reactive stress on the circuit breaker with a relatively smaller transient thermal stress. This case also requires that the circuit breaker delay before actuating, either to allow the fault to clear itself or for a circuit breaker closer to the fault to trip, to provide better selectivity and security through coordination. Therefore, this case is referred to as a "slow" trip.

Figure 18:
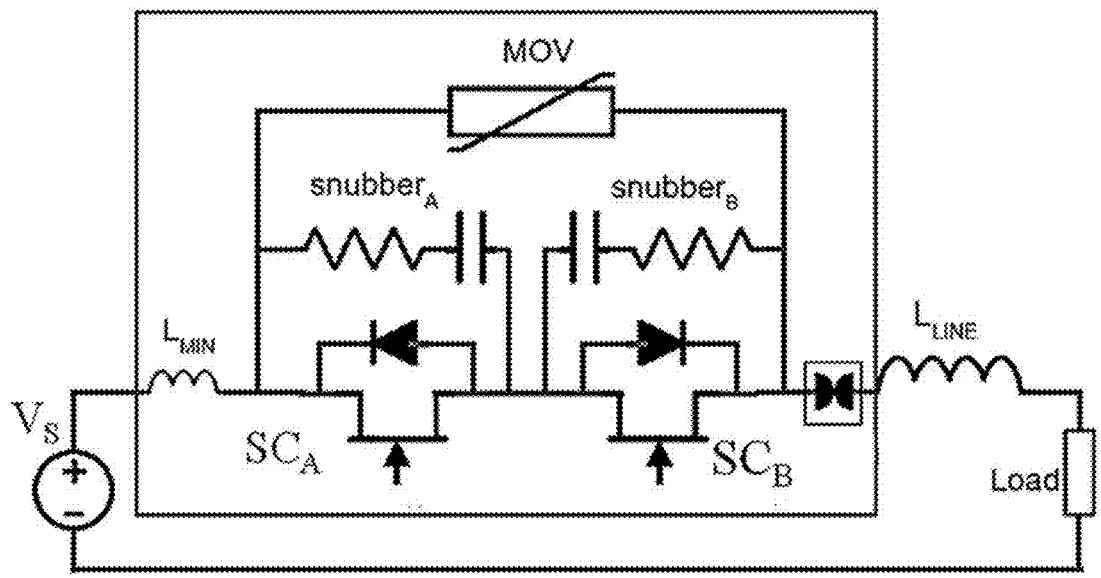
FIG. 18 is a schematic illustrating an example of a power stage of a bidirectional solid state circuit breaker (BSSCB), in accordance with various embodiments of the present disclosure.

When Fault-B occurs, the energy stored in the system inductance must be dissipated in the course of actuation resulting in a voltage overshoot at the terminals of the circuit breaker. The full bi-directional SSCB (BSSCB) topology comprises multiple parallel branches, each representing a layer of energy absorption that will activate as the previous layer reaches capacity during a short circuit event. FIG. 18 is a schematic illustrating a power stage of a BSSCB. The first layer is the semiconductor device layer, which drives the actual current interruption. This layer can comprise two SCs placed back to back in a common source topology to support bidirectional protection. The SCs can also be placed as common drain switches. Multiple JFETs can be connected in series and multiple SCs can be placed in parallel in order to meet all the design requirements of voltage and current. The remaining layers make up a network of transient energy absorbing components, depicted in FIG. 18 as an RC snubber in parallel with each switch block and a MOV in parallel with the entire switching module. A bidirectional switch, such as two IGBTs connected anti-parallel to each other, can be connected between the transient energy absorbing components and the SCs to allow for low current isolation of the absorbing components that may be needed at the end of a fault clearing operation, among other needs.

Semiconductor Device Layer. The semiconductor devices in the BSSCB form the first layer of switch activation and energy absorption. The primary role of the device layer is conducting the current during normal on-state and blocking the system voltage after actuation. The layer can be designed to dissipate a small amount of energy from the system relative to the stored energy (worst case for Fault-B). The number of JFETs in a SC string can be defined based on the system voltage which can be represented as:

$$N_S = \frac{V_{bus}(1 + X_S)}{V_{DS}}, \quad (14)$$

where $V_{bus}$ is the system voltage, $V_{DS}$ is the blocking voltage of each JFET, and $X_S$ is the percent safety margin. The $N_S$ is the number of JFET devices in series.

For a BSSCB under steady-state operation, the current will flow through one switching unit and the anti-parallel diode of the opposite switching unit. The total resistance of the device layer and the breaker efficiency can be defined as:

$$R_T = \frac{N_S R_{DS(on)}}{N_P} + R_D, \quad (15)$$

$$n = \frac{V_{bus} I_{nom} - I_{nom}^2 \left( \frac{N_S R_{DS(on)}}{N_P} + R_D \right)}{V_{bus} I_{nom}}, \quad (16)$$

where $R_{DS(on)}$ is the device on-state resistance and $R_D$ is the diode resistance. Simplifying and equating, the parallel configuration of devices to achieve the target efficiency is:

$$N_P = \frac{I_{nom} N_S R_{DS(on)}}{V_{bus}(1 - n) - I_{nom} R_D}, \quad (17)$$

where $N_P$ is the number of SC strings in parallel and n is the targeted system efficiency.

Equations (14)-(17) define the number of JFETs per SC and the SC in parallel to meet the electrical performance requirements. Thermal justification on how different series/parallel configurations of devices define the trip curve is discussed below in the sample design.

Current Limiting Inductance. As discussed, Fault-A as shown in FIG. 17 would produce an infinite di/dt. Hence, to guarantee the BSSCB can detect and respond to the "fastest fault," a current limiting inductance $L_{min}$ is added into the BSSCB as shown in FIG. 18, which also limits the peak current. The $L_{min}$ dictates the timing of current sensing mechanics, the computation time of the microcontroller and the gate drive actuation circuitry. The faster the controller acts, the lower the $L_{min}$ value needed.

$$L_{min} \geq \frac{V_S}{\frac{di}{dt_{max}}} \quad (18)$$

Transient Absorption Layer. The BSSCB is composed of functional "layers." When the device (or semiconductor module) layer receives an actuation signal from a sense & control layer to interrupt the peak allowed fault current, the module opens and commutates current to the snubber layer. The snubber shapes the di/dt to limit overshoot voltage from the cable inductance. As the snubber capacitor charges, the current commutates to the MOV clamping the overshoot voltage seen by the module. See, e.g., FIG. 18.

MOV Selection: Metal Oxide Varistor (MOV) is a non-linear resistor element to clamp the overvoltage and follows the power law, $$I = kV^\alpha, \tag{19}$$

where k is constant related to the geometrical structure and a is dependent on the material properties and degree of nonlinearity during conduction. The value of a typically is between 5 and 20 resulting in characteristics similar to a TVS diode, clamping the voltage due to a decreasing resistance. For the energy absorption circuitry, the Varistor or MOV must be sized to ensure that the MOV always operates in a safe operating area, and should also provide dissipation of energy from the power network when current is interrupted. Thus, the maximum energy through the MOV needs to be estimated based on the current through the circuit and the clamping voltage of the MOV.

Figure 19:
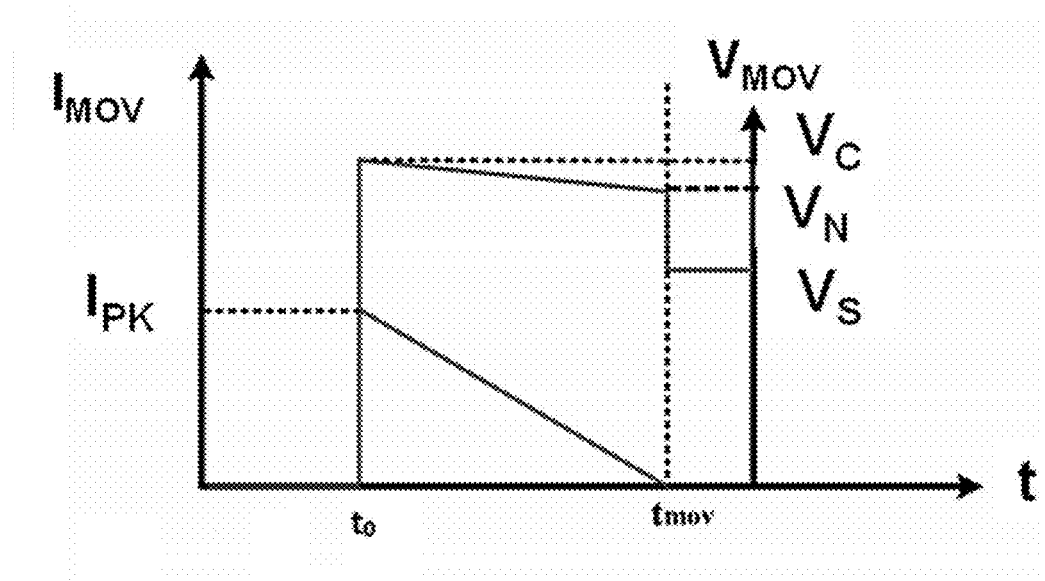
FIG. 19 illustrates an example of a turn-off transition of a solid state circuit breaker (SSCB), in accordance with various embodiments of the present disclosure.

An example of a typical turn-off transition of a SSCB is shown in FIG. 19, where $I_{pk}$ is the peak current, $t_0$ is time the fault is detected and $t_{mov}$ is time the SSCB takes to de-energize the line. The energy the MOV absorbs is given by:

$$E_{mov} = \int_{t_0}^{t_{mov}} V_{mov} I_{mov} dt, \tag{20}$$

where the time to de-energize the line is:

$$t_{mov} = \frac{L_{line} I_{pk}}{V_C - V_N}. \tag{21}$$

Here, $V_C$ is the MOV clamping voltage, $V_N$ is the overshoot at which MOV starts to act, and $L_{line}$ is the line inductance.

Snubber Design: To regulate the di/dt and the dv/dt in the circuit. Snubbers can be placed across the device for protection and to improve the performance of the system by reducing voltage or current spikes and to dampen oscillation. Together with MOV the snubber ensures that the load line is kept within the safe operating area (SOA) and provides an alternative path for power dissipation from the switch to the snubbing resistor. The RC snubber ($R_S$ and $C_S$) can be designed using:

$$R_S = \frac{V_N - V_S}{I_{SC\_max}}, \tag{22}$$

$$C_S > \frac{(L_{line} + L_{min}) I_{SC\_max}^2}{V_S^2}, \tag{23}$$

where, $V_N$ is the nominal voltage (voltage at which MOV starts to act), $V_S$ is the source voltage, $I_{SC\_max}$ is the maximum short circuit current, and $L_{line}$ is the line inductance.

Controller Design. Two sensors can be utilized in the SSCB to implement the scheme: 1) a differential voltage sensor senses voltage across the current limiting inductance, $L_{min}$ to monitor the system di/dt; and/or 2) a resistive current sensor measures the bidirectional current flow into the BSSCB. A unique low-cost, high bandwidth (e.g. >20 MHz) and low overshoot sensor was utilized for this application.

The sensors measured the system di/dt, $V_{DS}$ of SC and $I_{sense}$ of the DC system. The measured signal can be computed and processed by the microprocessor to monitor the DC system, and in case of fault the microprocessor can also issue a trip signal to trigger gate drive circuits.

Figure 20:
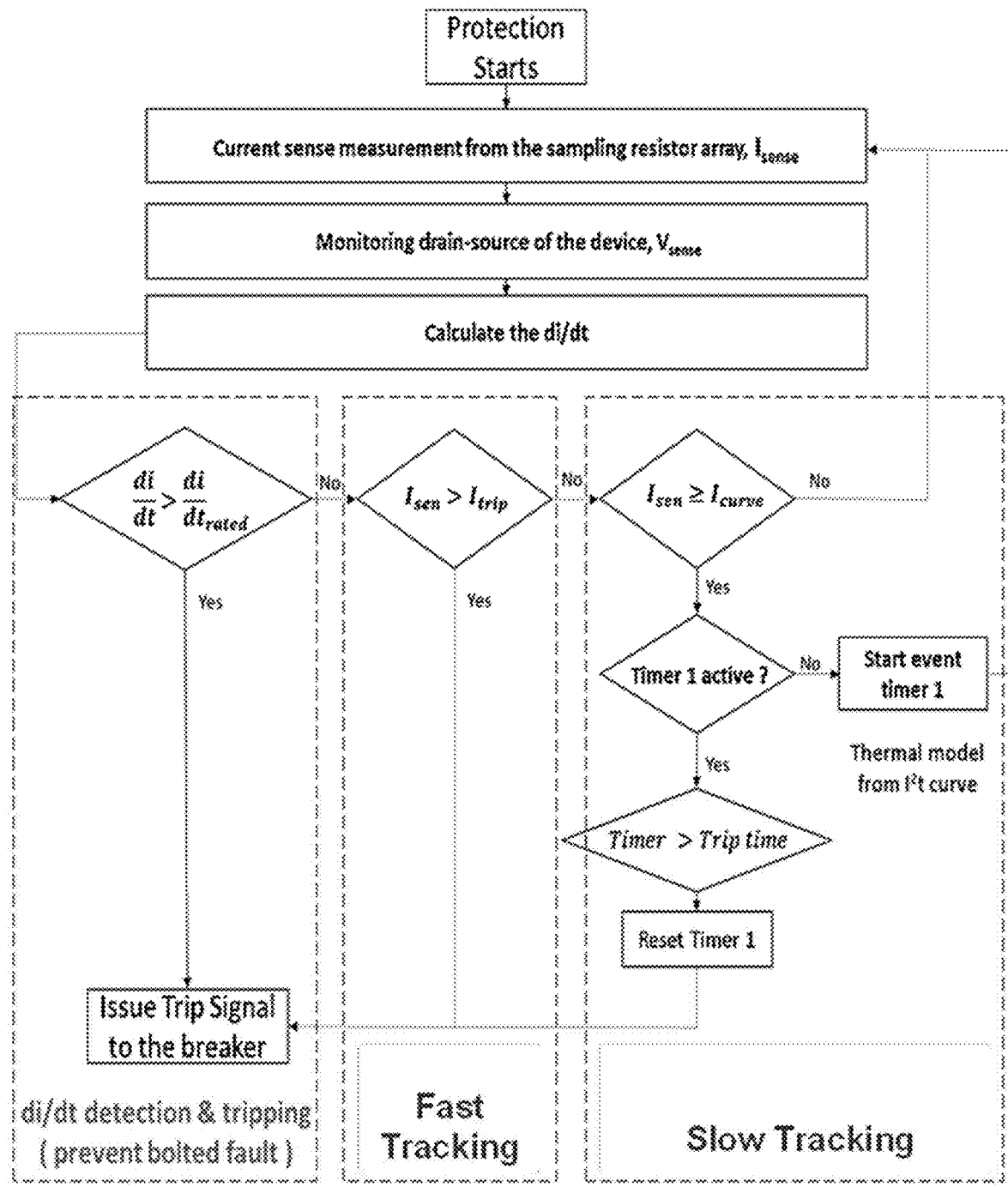
FIG. 20 is a flowchart illustrating an example of a SSCB control scheme, in accordance with various embodiments of the present disclosure.

A PSoC® 5LP: CY8C58LP was selected as the microcontroller. FIG. 20 is a flowchart illustrating an example of the proposed SSCB scheme, which was software coded for digital control in TI Code Composer Studio (CCS). The scheme includes three modes of operation namely di/dt detection, fast-tracking and slow tracking. The di/dt detection and trip detects the di/dt and compares it against a maximum rate for the breaker. The fast-tracking detects a threshold value ($I_{trip}$) for an immediate trip, whereas slow tracking measures average current and ensures breaker operation within the thermally defined fuse curve described below in the sample design.

Sample Design

Using the design guidelines, the design for a 10 kV/100 A SSCB design using SC breaking elements was developed targeting the specifications presented in TABLE VII. The JFET selected for the SC based SSCB was the USCi-UJ3N17005 rated for $V_{DS}$=1.7 kV, $I_D$=204 A and $R_{DS}$(on)=6 mΩ at 70° C. ambient. Applying a 70% voltage safety margin to account for overshoot during turn off, the number of devices needed in series, $N_S$ was calculated from Equation (14) to be 10. Entering this value along with the system efficiency value of 98.4% into Equation (17) (for the back to back bidirectional approach), $N_P$ was calculated to be 3. To size component values for transient absorption for the example application discussed in this disclosure, a 15 m (50 ft) Cu cable was assumed with an inductance of 12 μH. Equations (19)-(23) were used to size the functional layers. The overall design is summed up and shown in TABLE VIII.

TABLE VII

| SSCB design target | |
|---|---|
| Category | Design Target |
| Rated Voltage | 10 kV |
| Rated Current | 100 A/10X surge |
| Power | 10 MW Steady-State @ >98% eff. |
| Response Time | 10X Dwell >5 ms |
| | Instant Trip <250 ns |
| Cooling | 70° C. Ambient |

TABLE VIII

| Overall BSSCB design | |
|---|---|
| Category | Design |
| Semiconductor Layer: Common-source connected SCs | |
| Rated Voltage | 17 Kv |
| Rated Current | 204 A @ 25° C./118 A @125° C. |
| Layout (x2 for bidirectional) | $N_{series}$ = 10, $N_{parallel}$ = 3 |
| Efficiency | 98.4% |
| Snubber Layer | |
| Capacitance and Resistance | 680 nF and 10 Ω |
| MOV Layer | |
| Clamping Voltage | 16.5 Kv |
| Nominal Voltage | 10.5 Kv |

Defining Trip Curve. Thermal analysis was performed to evaluate the trip curve of the prospective power stage for the supercascode based BSSCB design. As discussed in the case example, the design has three SC power modules (SCPMs) in parallel such that each JFET carries a nominal current of 33 A. To extract the fuse curve, time-dependent heat transfer simulations were performed using FEA, evaluating the temperature rise in the device for each multiple of nominal current through 10× of rated current. The fuse time is defined as the time the device takes to reach a critical junction temperature, $T_j$ of 175° C. from 40° C. ambient. Two power stage designs were considered and compared. The first uses a standard Alumina based ceramic substrate and the second a new Epoxy Rosin Composite Dielectric (ERCD) substrate, both rated for 10 kV. Multiphysics simulations were performed in COMSOL. The boundary conditions for the simulations were:

All surfaces aside from the bottom side of the base plate are insulated;

Volumetric heat source is defined over the body of the device equal to the power dissipation due to the current; and Surface heat flux is defined on the bottom of the baseplate to reflect heat sinking. This heat flux is defined by a user defined heat transfer coefficient h=15 W/m²K to reflect a conservative estimate for natural air convection.

The power dissipation was calculated dynamically using an analytical function describing the temperature dependence of $R_{DS(on)}$, which was extracted from the device datasheet. The material thicknesses and properties used in the simulations are shown in TABLE IX and X. The fuse time for each current case was extracted for each power stage design.

TABLE IX

Material Thickness and Properties of simulated power module with Alumina DBC Substrate

| Layer | Thickness [mm] | $C_p$ [J/kg] | P [kg/m³] | K [W/mK] |
|---|---|---|---|---|
| SiC | 0.15 | 1200 | 3200 | 450 |
| Ag Sinter | 0.035 | 235 | 10500 | 175 |
| Cu pad | 0.127 | 385 | 8700 | 400 |
| Alumina | 0.508 | 900 | 3900 | 27 |
| Cu pad | 0.127 | 385 | 8700 | 400 |
| Ag Sinter | 0.035 | 235 | 10500 | 175 |
| AlSiC | 2 | 741 | 3010 | 180 |

TABLE X

Material Thickness and Properties of simulated power module with ERCD Substrate

| Layer | Thickness [mm] | $C_p$ [J/kg] | P [kg/m³] | K [W/mK] |
|---|---|---|---|---|
| SiC | 0.15 | 1200 | 3200 | 450 |
| Ag Sinter | 0.035 | 235 | 10500 | 175 |
| Cu pad | 0.127 | 385 | 8700 | 400 |
| ERCD | 0.24 | 901 | 3900 | 8 |
| Cu pad | 0.127 | 385 | 8700 | 400 |
| Ag Sinter | 0.035 | 235 | 10500 | 175 |
| AlSiC | 2 | 741 | 3010 | 180 |

Figure 21:
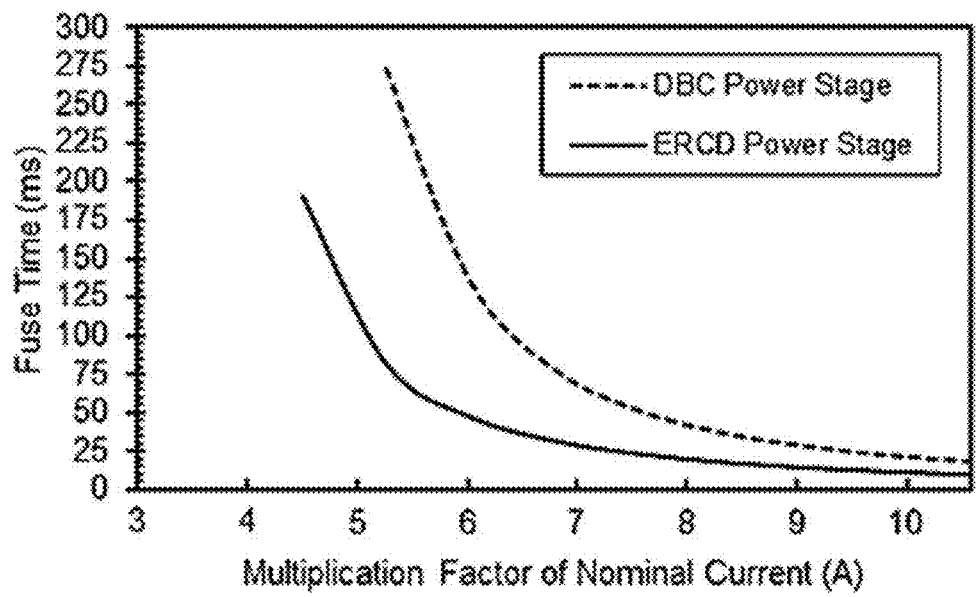
FIG. 21 illustrates an example of a fuse curve of a SSCB with DBC and ERCD stack-up, in accordance with various embodiments of the present disclosure.

The results are plotted in FIG. 21, which shows the fuse curve of the SSCB with DBC and ERCD stack-up. These curves define the maximum operating limits of the SSCB using the concomitant power stage solution without additional thermal capacity and optimization. The results indicate that the DBC power stage has a larger fuse curve than ERCD power stage making it more suitable to more applications, but at a cost. If concluding that both ERCD and DBC based power stages can be used, the ERCD offers better mechanical reliability at a lower cost whereas DBC allows for a wider fuse curve.

Experimental Testing

Figure 22:
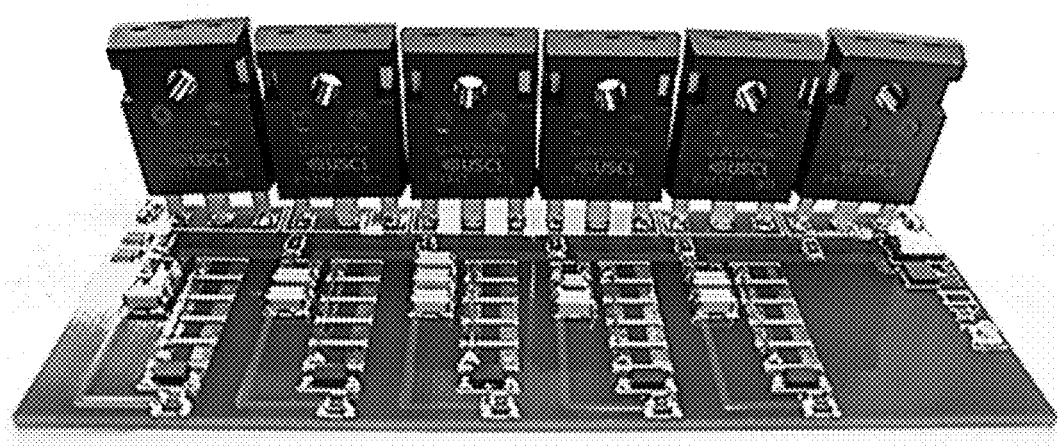
FIG. 22 is an image of a 6 kV/10 A SC power module (SCPM) power switch prototype, in accordance with various embodiments of the present disclosure.

A prototype 6 kV/10 A SCPM was fabricated from commercially available packaged JFETs to validate the feasibility of the SCPM topology as the breaking element for SSCBs. The prototype included six 1.2 kV/80 mΩ normally-on SiC JFETs (UJN1208K) controlled by a 25V MOSFET (BSZ018NE2LSIATMA1) based on the avalanche rugged topology shown in FIGS. 2B. The component values are given in TABLE I and an image of the physical prototype of the 6 kV/10 A SCPM power switch is shown in FIG. 22. An optically isolated gate driver operating between 0-10 V provided sufficient signal isolation to the power devices and a 9V battery was used to isolate voltage.

Figure 23A:
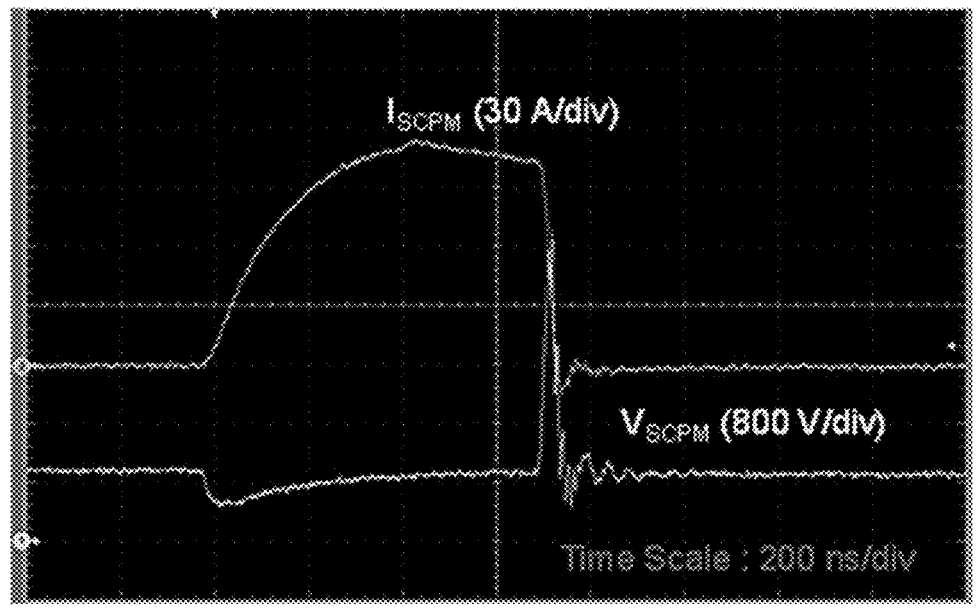
FIGS. 23A-23B and 24A-24B illustrate waveforms of short circuit tests of the SCPM of FIG. 22, in accordance with various embodiments of the present disclosure.
Figure 23B:
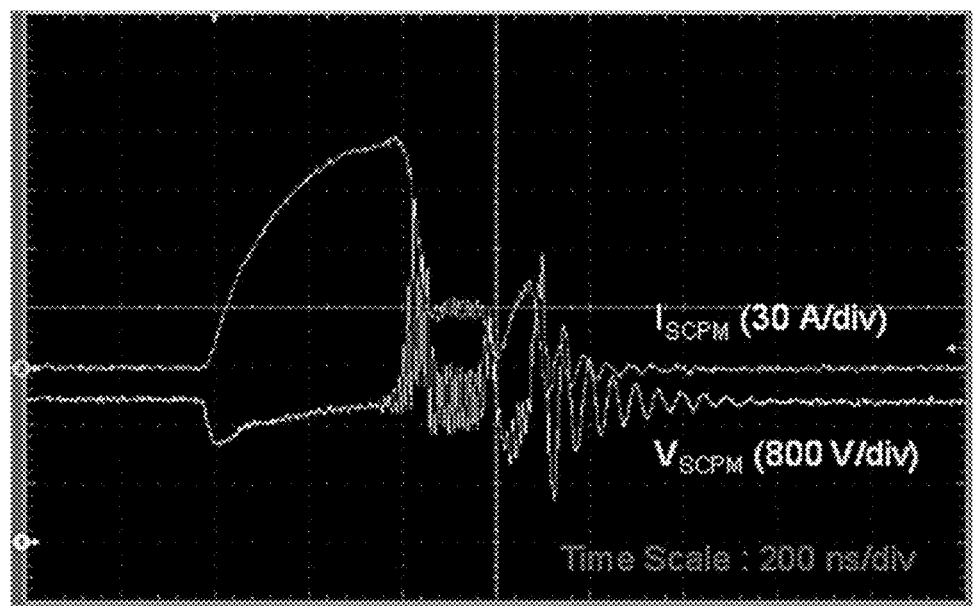

Two fault scenarios were tested, first the SOPS was opened into a fault without any resistance or inductance limiting the current up to 2 kV for 1 μs driving the SSCB into saturation. FIGS. 23A and 23B illustrate the SCPM short circuit tests at 1 kV and 2 kV bus voltages, respectively. Current interruption was also successful in the dead fault short-circuit test. At 1 kV there was an indication of current saturation and at 2 kV oscillations began to occur from the gate drive despite the optical isolation. Despite the oscillation, the SSCB was still controllable as the current was reduced to zero.

Figure 24A:
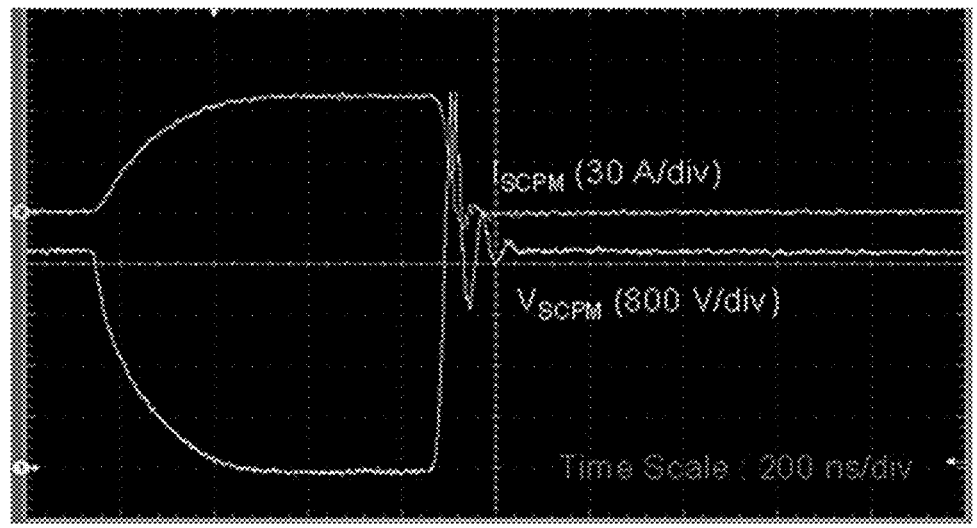
Figure 24B:
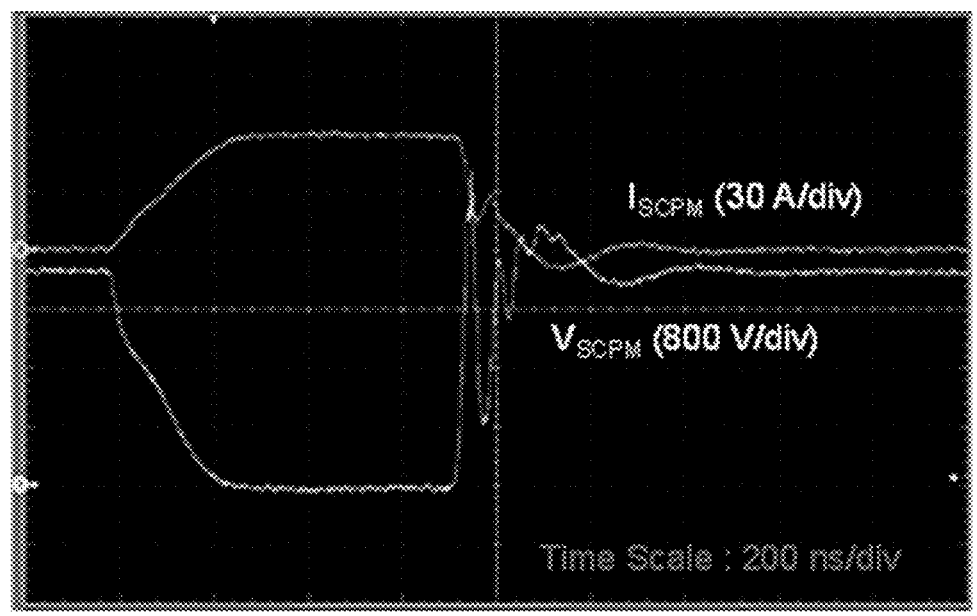

Second, overcurrent tests were performed for 1 μs durations with a DC bus of 3.5 kV wherein the SCPM is connected in series to a 50Ω and 12 μH RL load resulting in a 70 A fault current (7× rated current). The switching waveforms for SCPM short circuit tests at 1 kV bus voltage are shown in FIGS. 24A and 24B without transient energy absorption circuitry and with snubber circuitry, respectively. Inferring from the results, the RC transient snubber of 100 and 680 nF decreased the overshoot by 1.3 kV.

The results demonstrate that the SOPS topology using commercially available SiC JFETs is capable of detecting fault in less than 1 μs as a fast transient response and can successfully interrupt the current in 60 ns. In particular, the avalanche balancing network is capable of maintaining sequential switching despite the high di/dt and dv/dt.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

The term "substantially" is meant to permit deviations from the descriptive term that don't negatively impact the intended purpose. Descriptive terms are implicitly understood to be modified by the word substantially, even if the term is not explicitly modified by the word substantially.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A cascaded supercascode (CSC) power switch, comprising:
   a series of n unit supercascode (USC) circuits with n greater than 1, each of the n USC circuits comprising first and second switches coupled in series and an internal balancing network coupled across the first and second switches, wherein a source of each of the n USC circuits is a source of the first switch and the internal balancing network comprises a capacitor connected between a gate of the second switch and the source of the first switch and a diode connected in parallel with the capacitor;
   a control switch coupled in series with the series of n USC circuits; and
   an external balancing network coupled to each of the n USC circuits.

2. The CSC power switch of claim 1, wherein the internal balancing network comprises a resistor connected in series with the diode, the resistor and diode connected in parallel with the capacitor.

3. The CSC power switch of claim 1, wherein the internal balancing network comprises a resistor connected between the gate of the second switch and a drain of the second switch.

4. The CSC power switch of claim 1, wherein the internal balancing network comprises a resistor connected between the source of the first switch and the capacitor.

5. The CSC power switch of claim 1, wherein a drain of each of the n USC circuits is a drain of the second switch.

6. The CSC power switch of claim 2, wherein each of the n USC circuits comprises a third switch coupled in series with the first and second switches and connected to the internal balancing network.

7. The CSC power switch of claim 6, wherein the internal balancing network comprises a second capacitor connected between the gate of the second switch and a gate of the third switch and a second diode connected in parallel with the second capacitor.

8. The CSC power switch of claim 7, wherein the internal balancing network comprises a second resistor connected in series with the second diode, the second resistor and second diode connected in parallel with the second capacitor.

9. The CSC power switch of claim 7, wherein the internal balancing network comprises another resistor connected between the gate of the third switch and a drain of the third switch.

10. The CSC power switch of claim 6, wherein a drain of each of the n USC circuits is a drain of the third switch.

11. The CSC power switch of claim 1, wherein a drain of the control switch is connected to the source of a last (n) USC circuit in the series of n USC circuits, and a source of the CSC power switch is a source of the control switch.

12. The CSC power switch of claim 1, wherein the first and second switches of each of the n USC circuits are n-channel or depletion mode GaN or SiC devices and the control switch is a low voltage normally-off device.

13. The CSC power switch of claim 1, wherein the first and second switches of each of the n USC circuits are JFETs and the control switch is a MOSFET.

14. A cascaded supercascode (CSC) power switch, comprising:
   a series of n unit supercascode (USC) circuits with n greater than 1, each of the n USC circuits comprising first and second switches coupled in series and an internal balancing network coupled across the first and second switches, where a source of each of the n USC circuits is a source of the first switch;
   a control switch coupled in series with the series of n USC circuits, where a drain of the control switch is connected to the source of a last (n) USC circuit in the series of n USC circuits, and a source of the CSC power switch is a source of the control switch; and
   an external balancing network coupled to each of the n USC circuits, wherein the external balancing network comprises an external capacitor connected between a gate of a second-to-last (n−1) USC circuit and the source of the CSC power switch, wherein a gate of the second-to-last (n−1) USC circuit is the gate of the first switch of the second-to-last (n−1) USC circuit, and an external diode connected in parallel with the external capacitor.

15. The CSC power switch of claim 14, wherein the external balancing network comprises an external resistor connected between a gate of the first USC circuit in the series of n USC circuits and a drain of the CSC power switch.

16. The CSC power switch of claim 14, wherein the external balancing network comprises a second external capacitor connected between the gate of the second-to-last (n−1) USC circuit and a gate of a third-to-last (n−2) USC circuit in the series of n USC circuits, and a second external diode connected in parallel with the second external capacitor.

17. The CSC power switch of claim 14, wherein the external balancing network comprises two external diodes connected in series, the two external diodes connected in parallel with the external capacitor.

18. The CSC power switch of claim 17, wherein the external balancing network comprises a resistor connected in series with the two external diodes, the resistor and the two diodes connected in parallel with the external capacitor.

19. The CSC power switch of claim 14, wherein the first and second switches of each of the n USC circuits are n-channel or depletion mode GaN or SiC devices and the control switch is a low voltage normally-off device.

20. The CSC power switch of claim 14, wherein the first and second switches of each of the n USC circuits are JFETs and the control switch is a MOSFET.

* * * * *